United States Patent [19]

Watanabe et al.

[11] 4,224,581
[45] Sep. 23, 1980

[54] COMPANDER SYSTEM HAVING LIMITER IN COMPRESSOR AND EXPANDER

[75] Inventors: Hiroshi Watanabe, Tokyo; Kenjiro Endoh; Motokazu Ohkawa, both of Yokohama; Kazuo Kitagawa, Kawasaki; Hideshi Kira, Yokohama, all of Japan

[73] Assignee: Tokyo Shibaura Electric Co., Ltd., Kawasaki, Japan

[21] Appl. No.: 844,198

[22] Filed: Oct. 21, 1977

[30] Foreign Application Priority Data

Oct. 21, 1976 [JP] Japan .................................. 51-126562
Oct. 21, 1976 [JP] Japan .................................. 51-126563
Oct. 21, 1976 [JP] Japan .......................... 51-141601[U]
Oct. 21, 1976 [JP] Japan .......................... 51-141602[U]

[51] Int. Cl.$^2$ ............................ H04B 1/64; H03G 7/00
[52] U.S. Cl. ...................................... 333/14; 307/264; 328/169; 330/51; 330/86; 330/126; 330/282
[58] Field of Search ................. 333/14; 328/168, 169, 328/172; 307/264; 330/126, 295; 179/1 P, 1 VL; 325/62, 65

[56] References Cited

U.S. PATENT DOCUMENTS

| 3,757,254 | 9/1973 | Takahashi et al. | 333/14 |
| 3,969,680 | 7/1976 | Wermuth | 333/14 X |
| 4,072,914 | 2/1978 | Haramoto et al. | 333/14 |

Primary Examiner—Paul L. Gensler
Attorney, Agent, or Firm—Oblon, Fisher, Spivak, McClelland & Maier

[57] ABSTRACT

A noise reduction system having an encoder which compresses the dynamic range of an analog audio signal, a transmission medium coupled to the encoder, and a decoder coupled to the transmission medium for expanding and thereby restoring the dynamic range of the compressed analog audio signal. The encoder includes a voltage controlled amplifier (VCA) receiving the audio signal, a high-pass filter also coupled to the analog audio signal, a circuit for obtaining a difference between the outputs of the VCA and the high-pass filter, weighting and level sensing circuits coupled to the encoder output for sensing the level of the compressed analog audio signal, and a limiter circuit coupled to the output of the weighting and level sensing circuits and producing a control voltage applied to the VCA control input in such a manner that the ratio of the gain of the VCA and the gain of the high-pass filter at the pass band thereof does not become less than one. The decoder includes circuits similar to those of the encoder and exhibits a transfer function substantially inverse to the encoder transfer function, with the controlling voltage applied to the decoder VCA such that the loop gain in the pass band of the high-pass filter does not become more than one.

14 Claims, 36 Drawing Figures

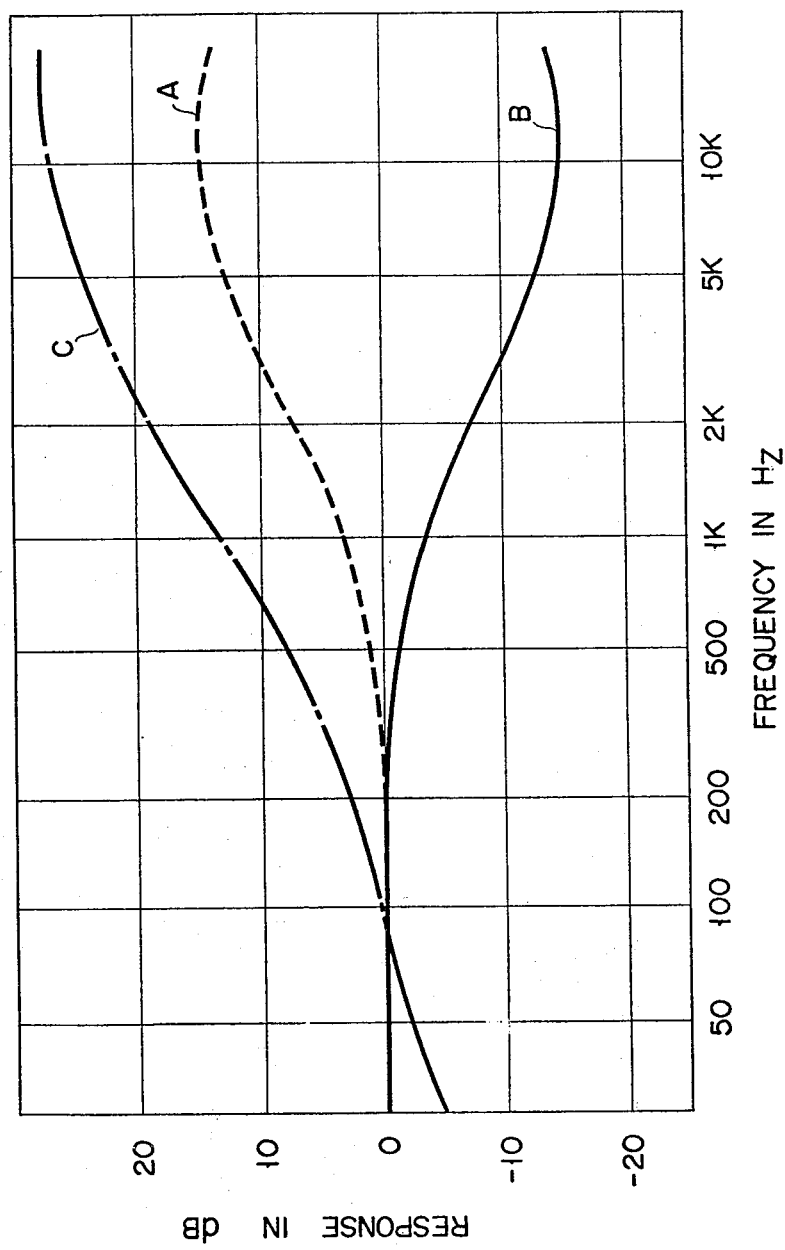

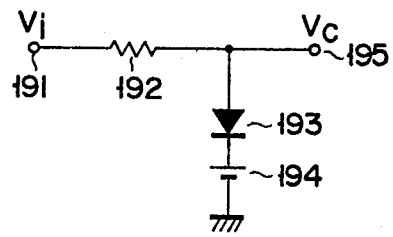
FIG. 19
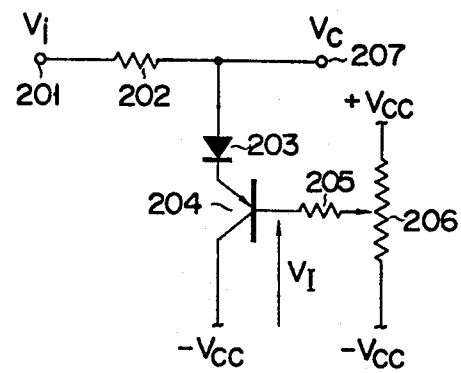
FIG. 20
FIG. 21A
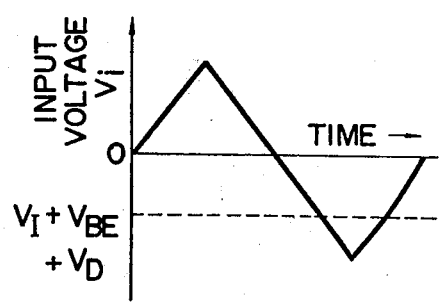
FIG. 21B
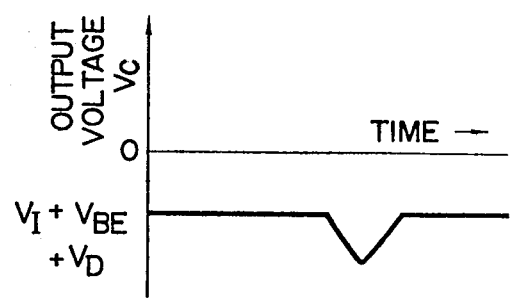

COMPANDER SYSTEM HAVING LIMITER IN COMPRESSOR AND EXPANDER

This invention relates to a noise reduction system wherein the emphasis amount and the gain of the system are increased and decreased according to the amplitude of an analog audio signal, and particularly to a noise reduction system wherein a limiter is employed to limit the control voltage on a variable response amplifier for controlling the amplitude and spectrum of an analog audio signal.

In case a noise reduction system which has poor improvement of S/N ratio is used for a transmission system such as a recording system and reproduction system which handles sound of high quality, the noise level is not conspicuously modulated by the audio signal level. However, if a noise reduction system having a much improvement of S/N ratio of transmission system is used, the noise level is modulated too much to be neglected. In particular, when such a noise reduction system is employed in a transmission system with a poor S/N ratio, the noise level is modulated so much that the noise reduction system becomes ineffective with respect to some specific sound sources. This would occur in such a noise reduction system with a highly improvement of S/N ratio as shown in FIG. 1, as will be explained with reference to FIG. 2.

The system shown in FIG. 1 comprises an encoder 2 connected to the input of a recording medium 1, e.g. tape recorder, thereby to compress the dynamic range of an analog audio signal during the recording operation and a decoder 3 connected to the output of the recording medium 1, thereby to expand the compressed analog audio signal and thus restore the dynamic range of the analog audio signal.

The encoder 2 is provided with a voltage-controlled amplifier 21, and the decoder 3 with a voltage-controlled amplifier 31. The amplifiers 21 and 31 act as multipliers. If they receive an input signal $e_i$ and a DC level E, they deliver an output signal $e_o$ which is represented as follows:

$$e_o = E^{\pm 1} \times e_i \qquad (1)$$

The exponent to DC level E is negative when the input signal $e_i$ is to be encoded and is positive when the input signal $e_1$ is to be decoded.

The encoder 2 and decoder 3 are further provided with a level sensor 22 and a level sensor 32, respectively. The level sensors 22 and 32 are to detect the level of a signal and deliver DC level E which corresponds to the level of the input signal e.

Thus, when supplied with an input signal $e_{i1}$, the encoder 2 supplies to the recorder 1 an output signal $e_{o1}$ which is represented as follows:

$$e_{o1} = E_{o1}^{-1} \times e_{i1} \qquad (2)$$

The level $E_{o1}$ of the output signal $e_{o1}$ of the encoder 2 is therefore expressed as follows:

$$E_{o1} = E_{o1}^{-1} \times E_{i1}$$

Hence, $$E_{o1} = E_{i1}^{\frac{1}{2}} \qquad (3)$$

An equation (3) shows, the level change of the input signal $e_{i1}$ is compressed to ½ in logarithmic scale during the encoding operation.

When supplied with an output signal $e_{i2}$ of the recorder 1, the decoder 3 delivers an output signal $e_{o2}$ which is represented as follows:

$$e_{o2} = E_{i2} \times e_{i2} \qquad (4)$$

The level $E_{o2}$ of the output signal $e_{o2}$ of the decoder 3 is therefore expressed as follows:

$$E_{o2} = E_{i2} \times E_{i2} = E_{i2}^2 \qquad (5)$$

As the equation (5) indicates, the level change of the input signal is expanded double in logarighmic scale.

The noise reduction system of FIG. 1 has such an operation characteristic as illustrated in FIG. 2. The encoder 2 compresses the dynamic range of an analog audio signal in such a manner as shown by a straight line A during the recording operation. The encoder converts an input signal of, for example, +20 dB into a signal of +10 dB, which is recorded on a recording medium 1 by the recorder, thereby increasing the peak margin of signal level. Similarly, it converts an input signal of, for example, −60 dB into a signal of −30 dB. As a result, any input signal has its dynamic range compressed to 50% and is then recorded by the recorder on a recording medium 1.

The decoder 3 expands the dynamic range of a signal recorded on the recording medium 1 in such a manner as shown by a straight line B during the reproduction operation. Namely the decoder 3 converts the signal of +10 dB recorded on the recording medium 1 into a signal of +20 dB. Similarly, it converts the signal of −30 dB recorded on the recording medium into a signal of −60 dB, thus reducing the noise by 30 dB. Thus, with respect to the input signal of −60 dB applied to the encoder 2, the S/N ratio of the recording medium 1 is improved by 30 dB when the decoder 3 delivers an output signal of −60 dB. Accordingly, the S/N ratio of the recording medium is improved to a degree which is usually expressed as: −1/2×level (dB) of input signal.

In the system shown in FIG. 1, however, the noise behind the output signal of the system is modulated according to a change in amplitude of audio signal. For instance, the S/N ratio of the system is improved by as much as 50 dB when an input signal of −100 dB is applied, and the noise in the output signal can be scarecely audible. In contrast, the S/N ratio is not improved at all when an input of 0 dB is applied.

Noise behind a sound of a large amplitude is nearly inaudible owing to masking effect. In this case the above-mentioned noise modulation does not make a problem practically. But noise behind sound of simple harmonic structure such as a piano solo cannot be masked and inevitably remains audible. If this is the case, the noise is heard as if changing in accordance with the rhythm of the music played. Such a change of noise level, if considerably intense, would more stimulate the listener's auditory sensation level than in case the noise has a constant level.

To lessen such stimulation to the listener's auditory sensation level, such a system as shown in FIG. 3 has been invented. This noise reduction system differs from the system shown in FIG. 2 in that there are provided a pre-emphasis circuit 23, a de-emphasis circuit 33 and two weighting circuits 24 and 34. The de-emphasis circuit 33 has such an operation characteristic as the curve B shown in FIG. 4 and serves to lower the gain of high frequency range to reduce much noise of recording medium, thereby to make the noise hard to hear. The de-emphasis circuit 33 inevitably attenuates musical sound of high frequency range, too. The pre-emphasis circuit 23 should therefore be used, which has such an operation characteristic the curve A as is shown in FIG. 4 and inverse to that of the de-emphasis circuit 33. If the gain for a signal of high frequency range is elevated during the recording operation, the peak margin is reduced with respect to the saturation signal level in the recording medium 1, and the waveform of the signal will be distorted. To avoid this distortion of waveform, the weighting circuits 24 and 34 having such an operation characteristic as the curve C shown in FIG. 4 are employed to elevate the sensitivity of level sensors 22 and 32 to the signals of high frequency range, whereby the input signals are compressed to a higher degree.

However, if the system of FIG. 3 is used in combination with a compact cassette tape recorder, it fails to reduce effectively the noise behind a signal for the following reason. A cassette tape can record but signals of a narrow frequency range and have a high noise level and a low saturation level. In case the signals represent sounds of a simple spectrum, the audible noise behind them will be modulated conspicuously. Further, if a signal has a spectrum extending all over the audible frequency range and has a high level, its high frequency component will be saturated. As a result, the sound reproduced from the cassette tape would become dull.

An ordinary cassette tape recorder has such a frequency characteristic as shown in FIG. 5. Apparently, the higher level a recorded signal has, the more deteriorated is the spectrum of the reproduced sound of high frequency range. That is, the quality of the reproduced sound is poor since the high frequency components of a musical sound cannot be reproduced in case the recorded musical sound has a high level even if it has not been encoded. In case an encoded signal whose high frequency component has been emphasized is recorded, the quality of the sound reproduced from the encoded signal will be deteriorated much more.

The object of this invention is to provide a noise reduction system which, when used in combination with a compact cassette tape recorder, can operate stably and minimize the quality deterioration of the sound reproduced by the cassette tape recorder.

According to one aspect of this invention there is provided a noise reduction system having an encoder which compresses the dynamic range of an analog audio signal to produce a compressed analog audio signal to be transferred and a decoder which expands the compressed analog audio signal obtained from a recording or transmission medium thereby to restore the dynamic range of the analog audio signal, whereby the noise behind the analog audio signal is reduced, the encoder including a first controlled amplifier by which the gain and the degree of the emphasis of high frequency range of the analog audio signal are controlled in accordance with the amplitude of the analog signal, the decoder having a second controlled amplifier having a transfer function which is substantially inverse to that of the first controlled amplifier of the encoder, the first controlled amplifier comprising a first voltage controlled amplifier (VCA) receiving the analog audio signal and in which the amplification factor thereof is varied by a first controlling voltage, a first high-pass filter receiving the analog audio signal, and means for obtaining a difference between the outputs of the first VCA and the first high-pass filter, the encoder further including a first level sensor for detecting the level of the compressed analog audio signal and a first limiter for limiting the output of the first level sensor to obtain said first controlling voltage in such a manner that the ratio between the gain of the first VCA and the gain of the first high-pass filter at the pass band thereof does not become less than one, and the second controlled amplifier comprises a second voltage controlled amplifier (VCA) rendered to vary the amplification factor in accordance with a second controlling voltage, a second high-pass filter having an input coupled to an output of the second VCA, means for adding the output of the second high-pass filter to the compressed analog audio signal to send forth the added signal to the second VCA to constitute a positive feedback loop, the decoder further including a second level sensor for detecting the level of compressed analog audio signal and a second limiter for limiting the output of the second level sensor to obtain said second controlling voltage in such a manner that the loop gain of the positive feedback loop at the second high-pass filter does not become more than one.

This invention can be more fully understood from the following detailed description when taken in conjunction with the accompanying drawings, in which:

FIG. 7 shows the operation characteristics of the constituent devices of the system shown in FIG. 6;

FIG. 19 is a circuit diagram of a unilateral limiter of fundamental type;

FIG. 20 is a circuit diagram of a sophisticated unilateral limiter;

FIGS. 21A and 21B show an input waveform and an output waveform of the limiter shown in FIG. 20, respectively;

Figure 3:
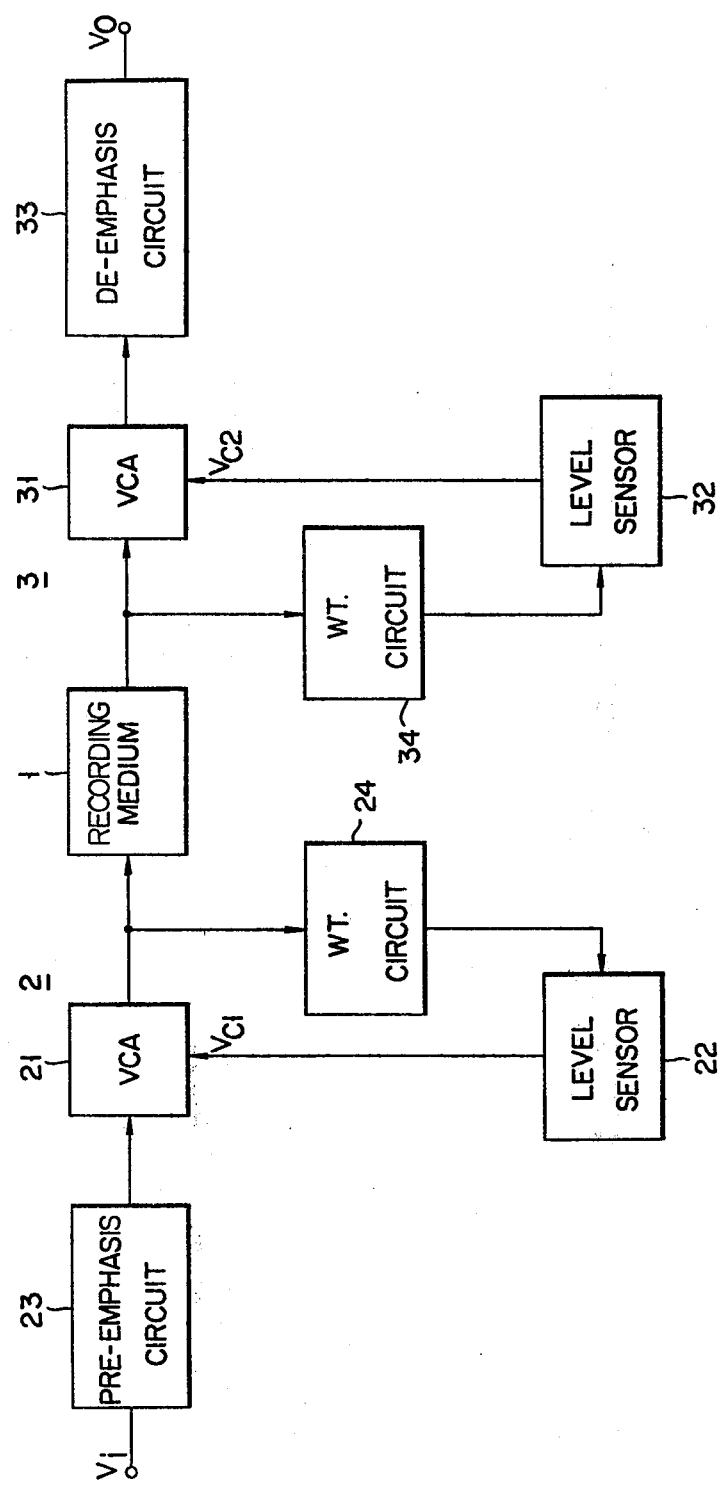
FIG. 3 is a block diagram of another conventional noise reduction system.
Figure 4:
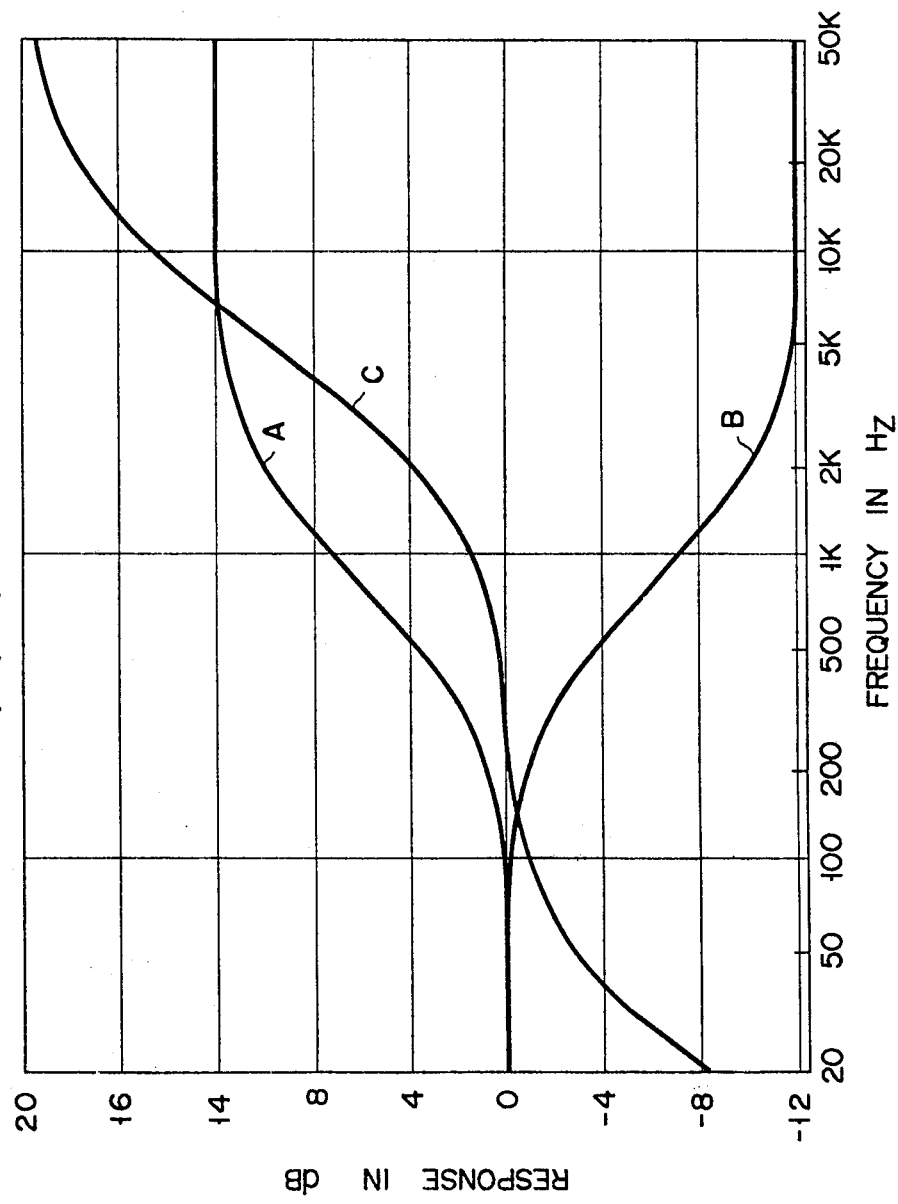
FIG. 4 shows the operation characteristics of the constituent devices of the system shown in FIG. 3.
Figure 5:
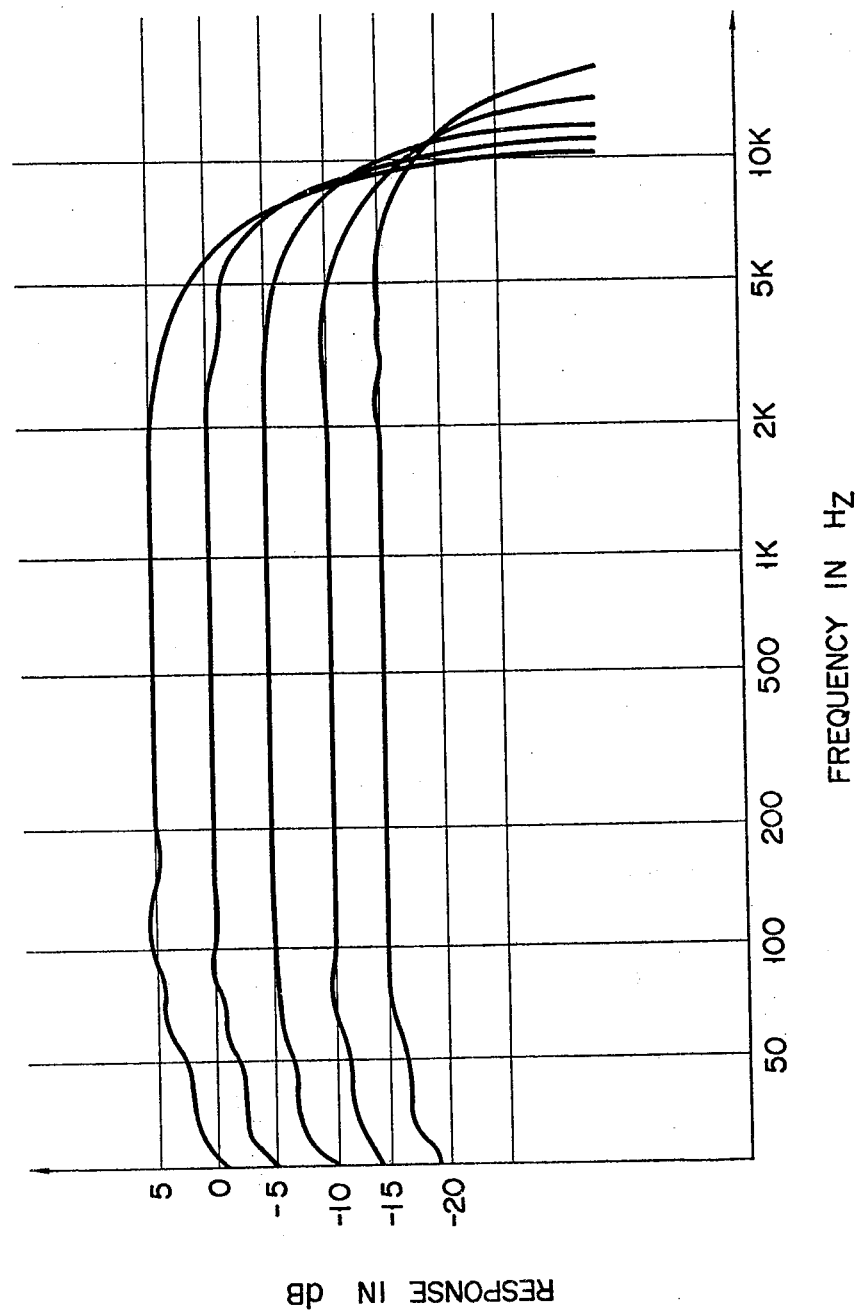
FIG. 5 shows the frequency characteristics of a cassette tape recorder in ordinary use.
Figure 6:
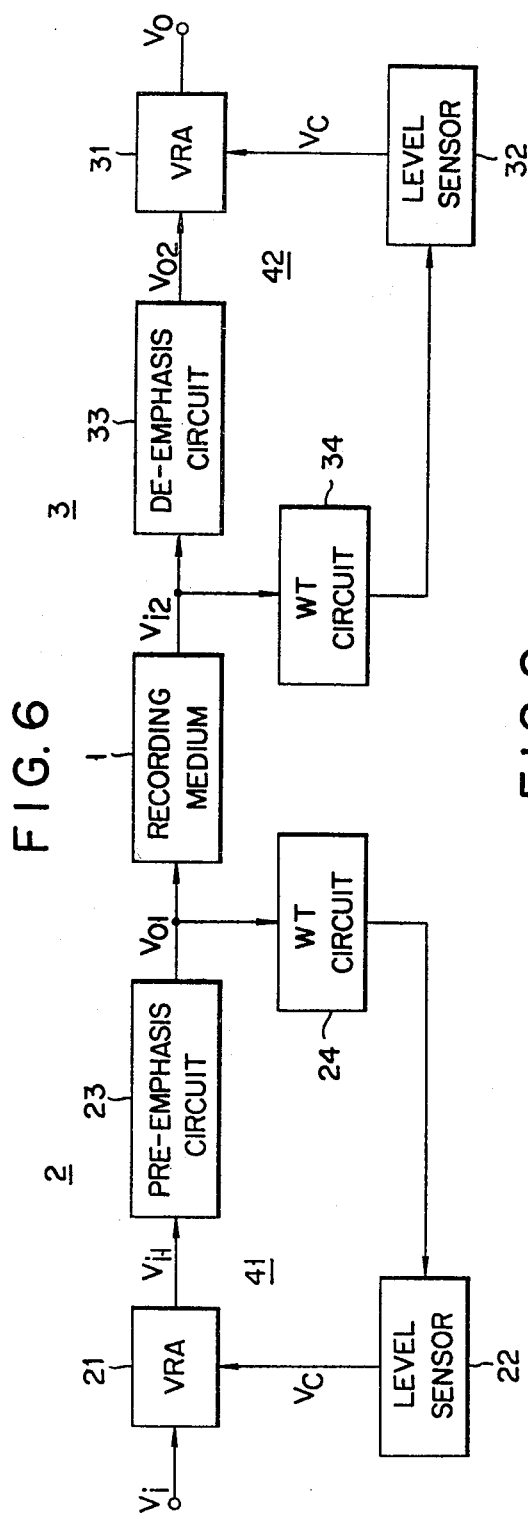
FIG. 6 is a block diagram of a noise reduction system according to this invention.

Like the conventional noise reduction system shown in FIG. 3, the system according to this invention as shown in FIG. 6 comprises level sensors 22, 32, a pre-emphasis circuit 23, a de-emphasis circuit 33 and weighting circuits 24 and 34. The system is further provided with variable response amplifiers 21 and 31. The variable response amplifier 21, level sensor 22, pre-emphasis circuit 23 and weighting circuit 24 constitute an encoder 2, while the variable response amplifier 31, level sensor 32, de-emphasis circuit 33 and weighting circuit 34 constitute a decoder 3.

The output signals of the level sensors 22 and 32 are supplied to the variable response amplifiers 21 and 31, respectively, thereby to control the gains and frequency characteristics of the varaiable response amplifiers 21 and 31 at the same time. In this case the pre-emphasis circuit 23, the de-emphasis circuit 33, and either of the weighting circuits 24 and 34 have such frequency characteristics as shown by curves A, B and C in FIG. 7 respectively.

In the encoder 2, the variable response amplifier 21 and the pre-emphasis circuit 23 constitute a controlled amplifier 41. Similarly, in the decoder 3, the variable response amplifier 31 and the de-emphasis circuit 33 constitute a controlled amplifier 42.

Figure 8:
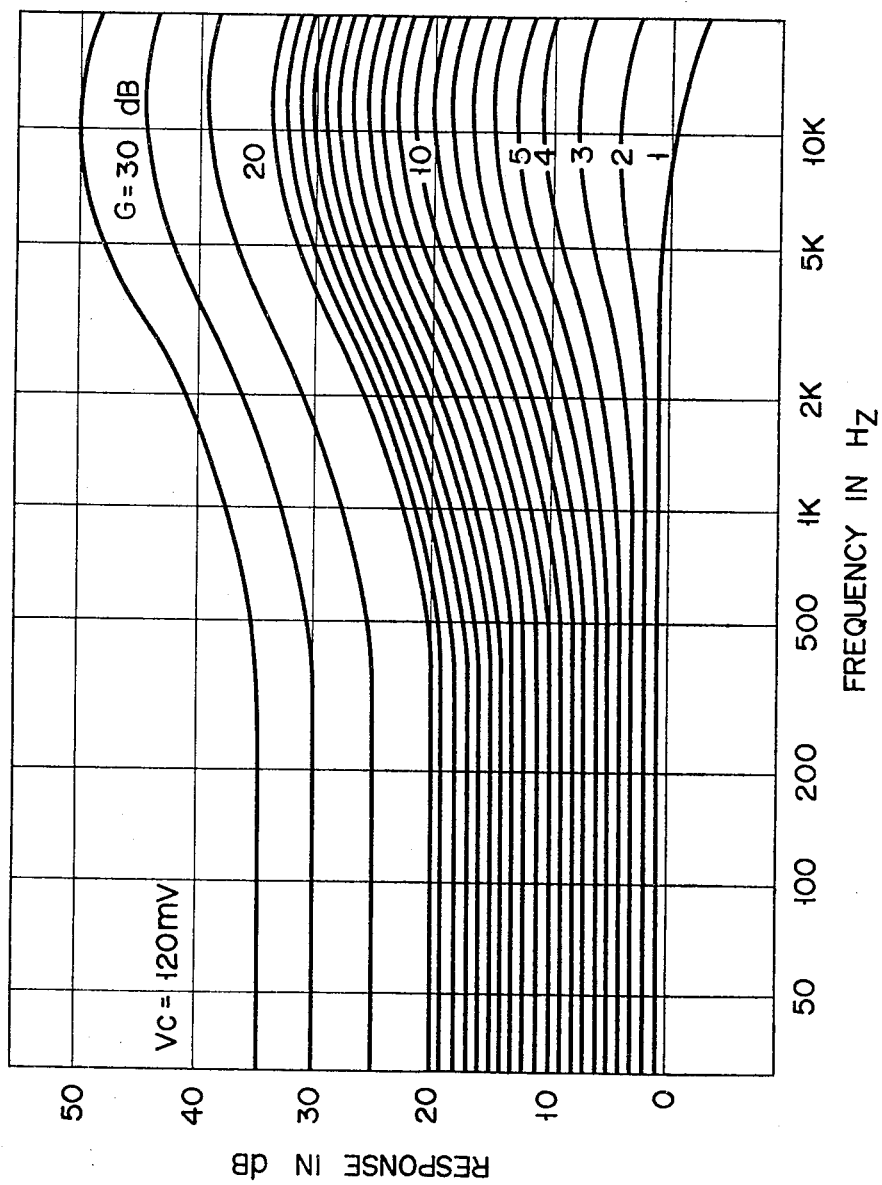
FIG. 8 shows the frequency response characteristics of the controlled amplifier used in the encoder of the system shown in FIG. 6.

The controlled amplifier 41 has such a frequency response characteristic as shown in FIG. 8. Namely, when a low control voltage $V_c$ is applied on the variable response amplifier 21 and thus the variable response amplifier 21 has a small gain G, the encoder 2 has a small gain over the entire audible frequency range and the amount of emphasis is not so large as in the following case. In case a high control voltage $V_c$ is applied on the variable response amplifier 21 and thus the variable response amplifier 21 has a high gain G, the gain of the encoder 2 is increased over the entire audible frequency range, and more increased at higher frequencies than at lower frequencies. In the former case the emphasis of high frequency band therefore becomes smaller than that in the latter case.

The variable response amplifier 31 of the decoder 3 has a transfer function which is substantially inverse to that of the variable response amplifier 21 used in the encoder 2.

The level sensors 22 and 32 are so designed as to produce an output signal of a low potential in response to an input signal of a high level and an output signal of a high potential in response to an input of a low level. Thus, when an input signal $V_i$ of a low level is supplied to the encoder 2, the variable response amplifier 21 amplifies the level of the input signal $V_i$, particularly the high frequency component of the input signal $V_i$. The output of the encoder 2 is then recorded by the recording medium 1 and thus added with noise. The signal obtained from the recording medium 1 is supplied to the decoder 3 and has its level lowered by the variable response amplifier 31 which has a transfer function substantially inverse to that of the variable response amplifier 21 of the encoder 2. Particularly, the high frequency component of the signal has its level lowered more than the low frequency component. As a result, the noise level of the signal is lowered as in the conventional noise reduction system shown in FIG. 3. If the emphasis of high frequency range can be made sufficiently large, the noise is compressed more than otherwise, and the modulation of noise can be made less audible.

When an input signal $V_i$ of a high level is applied to the encoder 2, the variable response amplifier 21 lowers the level of the signal $V_i$ relative to the former case thereby to increase the peak margin of signal level, just as in the conventional noise reduction system. Since the high frequency component of the input signal $V_i$ has its level lowered more than the low frequency component, its peak margin becomes larger than that of the low frequency component. Further, the modulation noise generated, for example, by the vibration of the magnetic tape on the recording medium 1 can be reduced. In the decoder 3 the lowered level of the input signal $V_i$ will be elevated to the original level.

Figure 9:
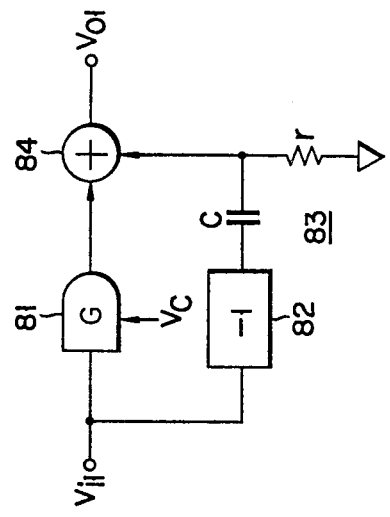
FIG. 9 is a block diagram of the variable response amplifier used in the encoder of the system shown in FIG. 6.
Figure 10:
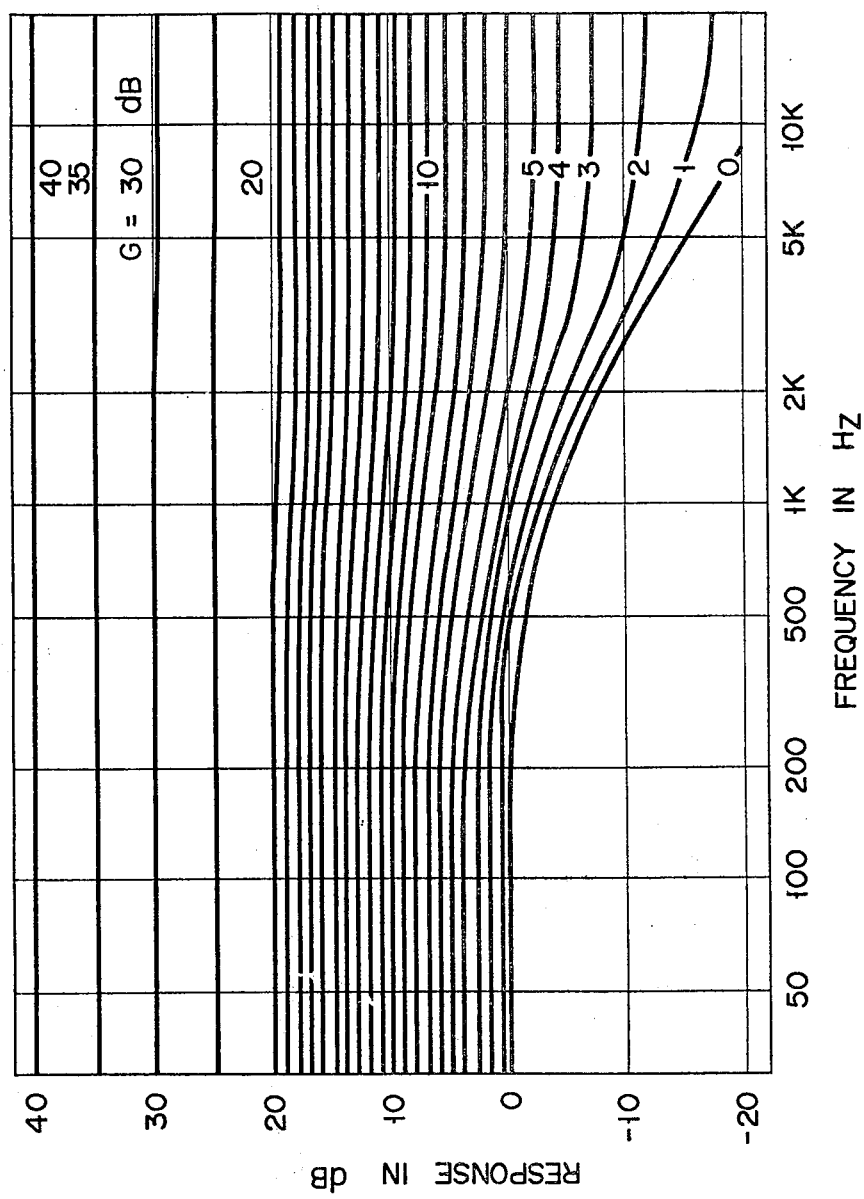
FIG. 10 shows the frequency response characteristics of the variable response amplifier shown in FIG. 9.

The variable response amplifier 21 of the encoder 2 may comprise a voltage-controlled amplifier 81 (hereinafter called "VCA 81"), an inversion amplifier 82, a high-pass filter 83 and an adder 84 as shown in FIG. 9. The variable response amplifier 21 has such a frequency-gain characteristic as shown in FIG. 10. The VCA 81 is of such a type wherein the gain G increases and decreases according to the control voltage $V_c$. The adder circuit 84, adds the output of the VCA 81 and the output of the inversion amplifier 82 coming through the high-pass filter 83. Let the gain of the VCA 81 be denoted by "G", and the transfer function between an input signal $V_{i1}$ and the output signal $V_{o1}$ of the adder circuit 84 be denoted by "$H_e(\omega)$". Then, the following equation will be established:

$$H_e(\omega) = \frac{V_{ol}}{V_{il}} = G - \frac{Scr}{1 + Scr} \tag{6}$$

In equation (6), $S = j\omega$, and "$\omega$", "c" and "r" denote an angular frequency, the capacitance of the capacitor C in the high-pass filter 83 and the resistance of the resistor r in the high-pass filter 83, respectively.

If the output of the VCA 81 is applied to the pre-emphasis circuit 23 when the gain G of the VCA 81 is 1 or more, the emphasis of high frequency range becomes smaller in case the gain G of VCA becomes lower with lower control voltage $V_c$. This is well understood from the frequency-gain characteristic of the variable response amplifier 21, which is shown in FIG. 10. When the gain G of the VCA 81 is less than 1, the emphasis of high frequency range becomes larger in case the gain G of VCA is low than in case gain G of VCA is high. This is an undesirable consequence and thus should be prevented. Thus, the VCA 81 should be used in such condition that the gain G of the VCA 81 be never less than 1, whereby the emphasis of high frequency range can be made smaller in case the amplification degree G is low than in case the amplification degree G is high. This is explained precisely afterwards.

Figure 13:
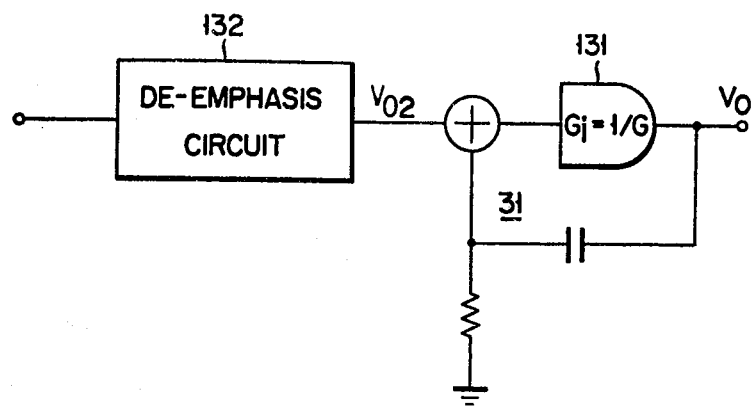
FIG. 13 is a block diagram of the controlled amplifier used in the decoder of the system shown in FIG. 6.

The controlled amplifier 42 of the decoder 3 is constructed as illustrated in FIG. 13. It comprises a de-emphasis circuit 132 and a VRA 31 for the decoder. The transfer function $H_d(\omega)$ between an input signal $V_{i2}$ and an output signal $V_{o2}$ of the VRA 31 is represented as follows:

$$H_d(\omega) = \frac{1}{G - \frac{Scr}{1 + Scr}} \tag{7}$$

Figure 11:
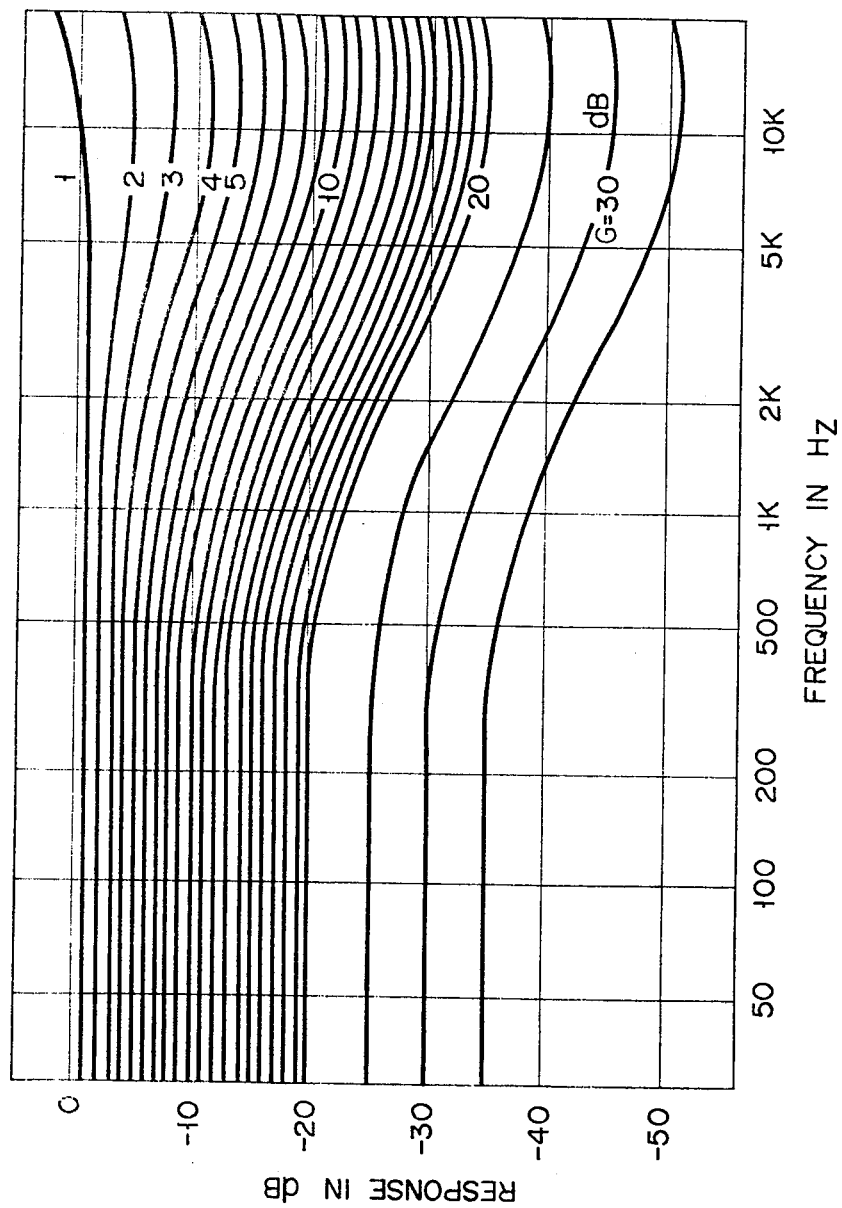
FIG. 11 shows the frequency response characteristics of the controlled amplifier used in the decoder of the system shown in FIG. 6.
Figure 12:
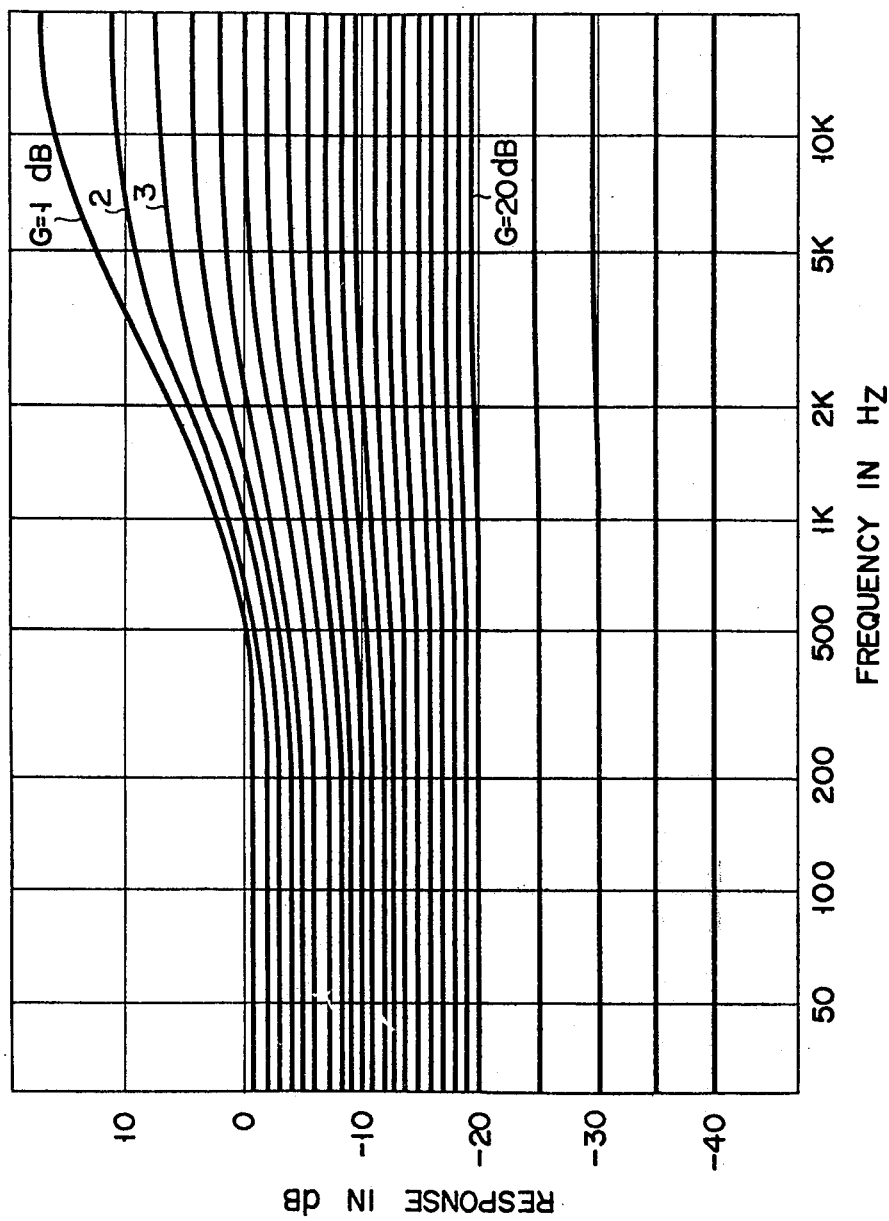
FIG. 12 shows the frequency response characteristics of the variable response amplifier used in the decoder of the system shown in FIG. 6.

The controlled amplifier 42 has such a frequency-response characteristic as is shown in FIG. 11 and substantially inverse to that of the encoder 2 shown in FIG. 8. To achieve this, the variable response amplifier 31 has transfer function $H_d(\omega)$ which is inverse to the transfer function $H_e(\omega)$ defined by equation (6). The variable response amplifier 31 with such transfer function $H_d(\omega)$ exhibits such a frequency-gain characteristic as shown in FIG. 12, so long as its gain $G_i(=1/G)$ remains less than 1.

In FIGS. 9 and 13, the values of the input and output signals of VRAs 21 and 31 are represented in voltage. Thus, the input impedance and output impedance of each block shown are regarded as being infinite and zero, respectively. If the VCA of the controlled amplifier 41 or 42 is to control the current of an input signal according to the control voltage, it requires no adder. It is therefore desired that the VCA be of such a type as could control the current of an input signal without any device for converting current into voltage so that the variable response amplifier 21 or 31 is made simple and can yet have such a frequency gain characteristic as shown in FIG. 10 or 12.

Figure 14A:
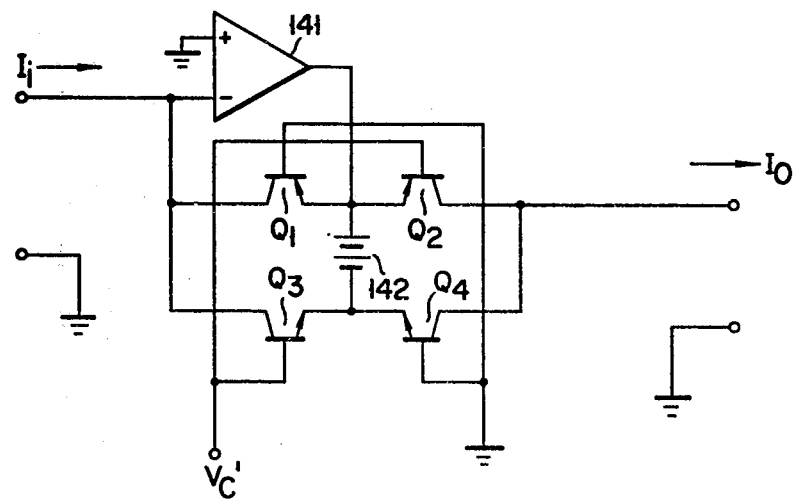
FIG. 14A is a circuit diagram of a current mode voltage-controlled amplifier.

FIG. 14A shows a VCA which can control the current of an input signal without any device for converting current into voltage. This VCA comprises transistors $Q_1$ to $Q_4$, a differential amplifier 141 and a constant voltage source 142. The transistors $Q_1$ and $Q_2$ serve to control the current of an input signal of the VCA and have their emitters connected mutually. Similarly the transistors $Q_3$ and $Q_4$ have their emitters connected mutually. The bases of the transistors $Q_2$ and $Q_3$ receive control voltage $V_c'$ while the bases of the transistors $Q_1$ and $Q_4$ are grounded. The constant voltage source 142 is connected between the emitters of the transistors $Q_1$ and $Q_3$. The differential amplifier 141 has its input terminal connected to the collectors of the transistors $Q_1$ and $Q_3$ and its output terminal connected to the emitters of the transistors $Q_1$ and $Q_2$.

Suppose four transistors $Q_1$ to $Q_4$ of the VCA have one and same operation characteristic. Then, the following equation is established:

$$I_o = -I_i \times \epsilon^{(Vc + Vbe)/VT} \tag{8}$$

Figure 14B:
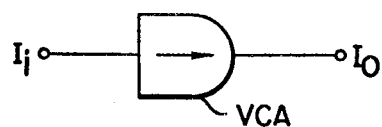
FIG. 14B is a symbol for the current mode voltage-controlled amplifier shown in FIG. 14A.

In equation (8), $V_T = kT/q$ and Vbe denotes a bias voltage where k is the Boltzmann constant, T is absolute temperature, and q is the numerical value of the electronic charge. The VCA wherein the relationship between the input and output signals is represented by equation (8) will be identified hereinafter with such a symbol as shown in FIG. 14B.

A variable response amplifier which includes such a VCA as shown in FIG. 14A and which exhibits such a frequency gain characteristic as shown in FIG. 10 will be described with reference to FIG. 15, and a variable response amplifier which includes such a VCA as shown in FIG. 14A and which exhibits such a frequency-gain characteristic as shown in FIG. 12 will be described with reference to FIG. 16.

Figure 15:
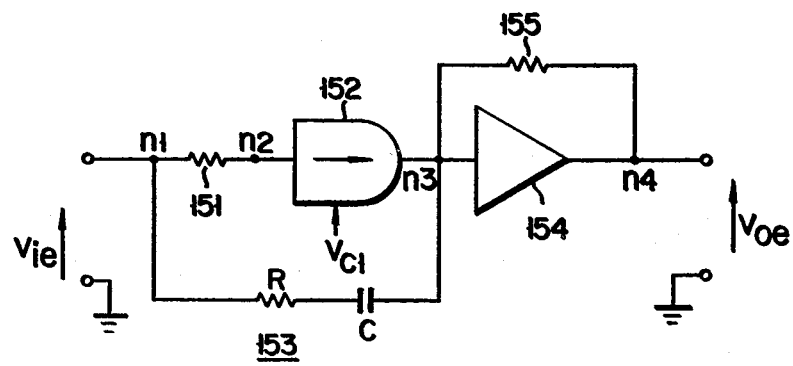
FIG. 15 is a circuit diagram of the variable response amplifier used in the encoder, using the current mode voltage-controlled amplifier shown in FIG. 14A.

The variable response amplifier of FIG. 15 comprises a resistor 151, a VCA 152, a series circuit 153, an operational amplifier 154 and a resistor 155. The resistor 151 is connected between the input terminal n1 of the variable response amplifier and the input terminal n2 of the VCA 152. The series circuit 153 is constituted by a resistor R and a capacitor C connected in series to each other and is connected between the input terminal n1 and the output terminal n3 of the VCA 152. The output terminal n3 of the VCA 152 is connected to the input terminal of the operational amplifier 154 and to the output terminal n4 thereof through the resistor 155.

Figure 16:
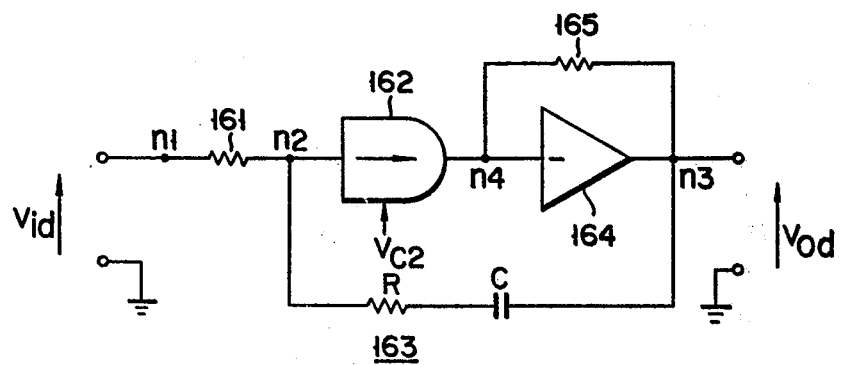
FIG. 16 is a circuit diagram of the variable response amplifier used in the decoder, using the current mode voltage-controlled amplifier shown in FIG. 14A.

The variable response amplifier of FIG. 16 is complementary to the variable response amplifier shown in FIG. 15. It comprises a resistor 161, a VCA 162, a series circuit 163, an operational amplifier 164 and a resistor 165. The input terminal n1 of this variable response amplifier is connected to the input terminal n2 of the VCA 162 through the resistor 161 and to the output terminal n3 of the operational amplifier 164 through the series circuit 163 which is constituted by a resistor R and a capacitor C connected in series to each other. The output terminal n4 of the VCA 162 is connected to the operational amplifier 164 and to the output terminal n3, i.e. the output terminal of this variable response amplifier, through the resistor 165.

It will be described how the variable response amplifier shown in FIG. 15 operates. The voltage $V_{ie}$ of an input signal is converted by the resistor 151 into current $I_1$ which is represented as follows:

$$I_1 = V_{ie}/R_{11}$$

where $R_{11}$ represents the resistance value of the resistor 151.

Current $I_1$ is then applied to the VCA 152 and multiplied by an amplification degree G which is determined by the control voltage $V_{cl}$ applied to the VCA 152 and which is expressed as follows:

$$G = -\text{EXP}[(V_{cl} + V_{be})/V_T]$$

And the output terminal n3 of the VCA 152 is supplied with current $G \cdot I_1$.

In the meantime, the input voltage $V_{ie}$ has been converted by the series circuit 153 into current $I_2$ which is represented as follows:

$$I_2 = j\omega c V_{ie}/(1 + j\omega cR)$$

Thus, current $G \cdot I_1$ and current $I_2$ flow together to the output terminal n3 of the VCA 152. In other words, the output terminal n3 is supplied with the following current:

$$(G \frac{V_{ie}}{R_{11}} + \frac{j\omega c}{1 + j\omega CR}) V_{ie}$$

Since both currents $G \cdot I_1$ and $I_2$ are made to flow through the resistor 155, the following relationship is established between the input voltage $V_{ie}$ and the output voltage $V_{oe}$:

$$\frac{V_{oe}}{V_{ie}} = H_{el}(\omega) \qquad (9)$$
$$= -R_{12}(\frac{G}{R_{11}} + \frac{j\omega c}{1 + j\omega cR})$$
$$= -\frac{R_{12}}{R_{11}} \cdot \frac{G + j\omega c(RG + R_{11})}{1 + j\omega cR}$$

where $R_{12}$ represents the value of the resistor 155.

Here, let $-(R_{12}/R_{11}G)$ be denoted as "G", and $R_{12}$ (=R) be denoted as "r". Then, equation (9) becomes identical with equation (6). To denote $-(R_{12}/R_{11})G$ as "G" is generally accepted, and to denote $R_{12}$ as "r" means that $V_{oe}/V_{ie}$ is multiplied by a constant. For this reason equation (9) can be considered equivalent to equation (6), and the variable response amplifier of FIG. 15 is provided to exhibit such a frequency-gain characteristic as shown in FIG. 10.

Now it will be described how the variable response amplifier shown in FIG. 16 operates. Let Gi be the gain of VCA 162. The voltage $V_{id}$ of an input signal is converted by the resistor 161 into current $V_{id}/R_{22}$, and an output voltage is converted by the series circuit 163 into current $j\omega c V_{od}/1 + j\omega cR$. Thus, the input terminal n2 of the VCA 162 is supplied with current $I_{1d}$ which is expressed as follows:

$$I_{1d} = (V_{id}/R_{22}) + (j\omega c V_{od}/1 + j\omega cR)$$

where $R_{22}$ denotes the value of the resistor 161.

Current $I_{2d}$ is amplified by the VCA 162, and the output terminal n4 is supplied with current $I_{2d}$ which is expressed as follows:

$$I_{2d} = -(\frac{V_{id}}{R_{22}} + \frac{j\omega c V_{od}}{1 + j\omega cR}) G_i$$

Current $I_{2d}$ is converted by the operational amplifier 164 and the resistor 165 into voltage $V_{od}$ which is represented as follows:

$$V_{od} = -R_{21}(\frac{V_{id}}{R_{22}} + \frac{j\omega c V_{od}}{1 + j\omega cR}) G_i \qquad (10)$$

where $R_{21}$ denotes a resistance value of the resistor 165.

Equation (10) is transformed into the following equation:

$$\frac{V_{id}}{V_{od}} = \frac{1}{H_d(\omega)}$$
$$= -R_{22}(\frac{1}{G_i R_{21}} + \frac{j\omega c}{1 + j\omega cR})$$

Here, let $R_{21}$ and $R_{22}$ be changed to $R_{11}$ and $R_{12}$, respectively and let $G_i$ be $1/G$. Then, the transfer function $H_d(\omega)$ of the variable response amplifier for the decoder is as follows:

$$H_d(\omega) = \frac{V_{od}}{V_{id}}$$
$$= -\frac{1}{R_{22}(\frac{1}{G_i R_{21}} + \frac{j\omega c}{1 + j\omega cR})}$$
$$= -\frac{R_{21}}{R_{22}} \cdot \frac{1 + j\omega cR}{1/G_i + j\omega c(R/G_i + R_{21})}$$
$$= -\frac{R_{11}}{R_{12}} \cdot \frac{1 + j\omega cR}{G + j\omega c(RG + R_{11})}$$

Consequently, the variable response amplifier of FIG. 16 is proved to exhibit such a frequency-gain characteristic as shown in FIG. 12.

If the variable response amplifiers shown in FIGS. 15 and 16 are used in the noise reduction system shown in FIG. 6, the system becomes simple in construction and yet can improve the S/N ratio, thereby making the modulated noise scarcely audible. In other words, if the variable response amplifiers of FIGS. 15 and 16 which are operated in current mode are used, the noise reduction system can be constituted by less elements in less steps of manufacture. It is therefore possible to provide at a low cost a noise reduction system which operates with a high efficiency.

Figure 17:
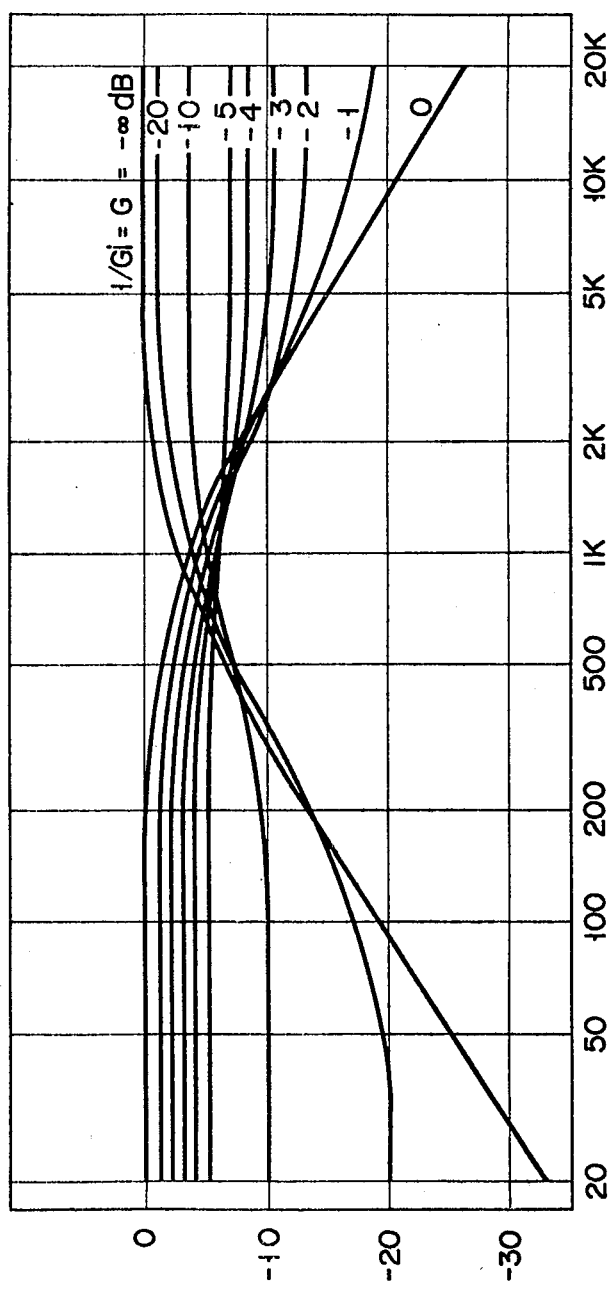
FIG. 17 shows the frequency response characteristics of the variable response amplifier shown in FIG. 9 while the gain G remains smaller than 0 dB.

In the variable response amplifier shown in FIG. 9, a characteristic curve of $(V_{o1} - V_{i1})$, if plotted in a range of $-G < R_{11}/R$, is as shown in FIG. 17 setting R as $R_{11}$. That is, a gain $-G$ is excessively decreased when an input signal of high level is applied, and if the gain $-G$ becomes smaller than $R_{11}/R$, a response of a high frequency range is raised more than that of a middle or low frequency range. As a result, a signal distortion occurs at a high frequency range and there also occurs modulation noise. Since $-G$ is an inverse number to $-G_1$, $-G_1$ is larger than $R/R_{11}$ so long as $-G$ remains less than $R_{11}/R$ in the VCA of the decoder 3. The operation of the VCA therefore becomes unstable because the imaginary part of the denominator of a transfer function shown in equation (11) of the VCA is made negative. In order to avoid such a state it is desired that voltages $V_{c1}$, $V_{c2}$ for controlling the VCA be restricted to a proper value.

Figure 18:
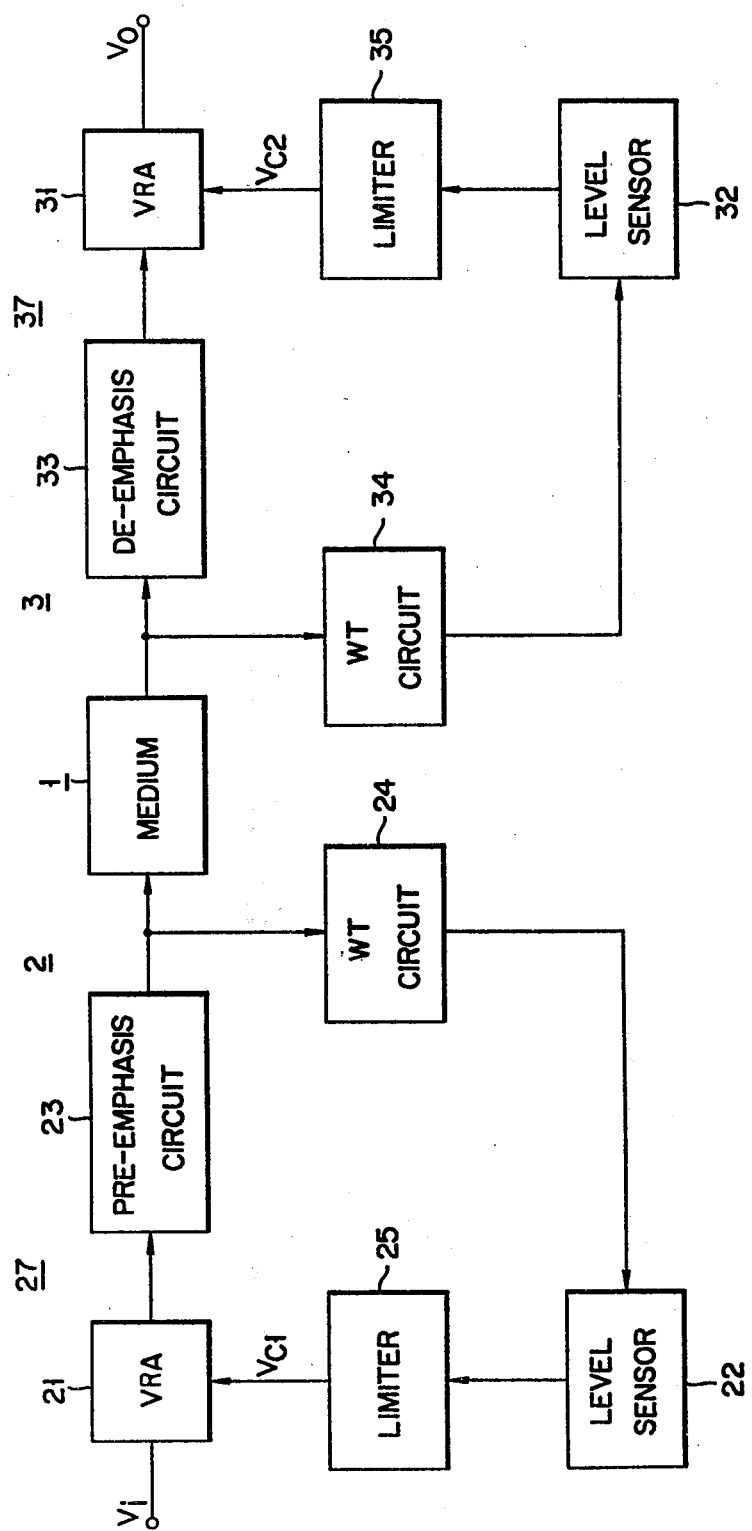
FIG. 18 is a block diagram of a noise reduction system according to this invention.

FIG. 18 is a block diagram of a noise reduction system according to one embodiment of this invention, which is provided with two limiters 25 and 35 adapted to control voltages $V_{c1}$ and $V_{c2}$, respectively. The limiter 25 is connected between a variable response amplifier 21 and a level sensor 22, and the limiter 35 between a variable response amplifier 31 and a level sensor 32. Each limiter is a unilateral one with such a basic construction as illustrated in FIG. 19. Its concrete construction is shown in FIG. 20.

Fundamentally, each limiter is constituted by an input terminal 191, a resistor 192, a diode 193, a power source 194 and an output terminal 195, as shown in FIG. 19. When an input voltage $V_i$ applied to the input terminal 191 is lower than the voltage of the power source 194, it is applied to the output terminal 195 through the resistor 192 and then acts as a control voltage $V_c$. When the input voltage $V_i$ is higher than the power source voltage, the output voltage is clamped by the diode 193 and the source 194. Thus the difference between the input voltage $V_i$ and the power source voltage is by-passed to the power source 194 through the diode 193. In this case, a limited control voltage $V_c$ appears at the output terminal 195.

Practically, as shown in FIG. 20, each limiter comprises an input terminal 201, a resistor 202, a diode 203, a transistor 204, a resistor 205, a resistor 206 and an output terminal 207. Here, let the forward voltage drop of the diode 203, the base-emitter voltage and the base voltage of the transistor 204 be denoted by $V_D$, $V_{BE}$ and $V_I$, respectively. Then the limiter produces the limited control voltage $V_C$ which is expressed as follows:

$$V_C = V_I + V_{BE} + V_D$$

If such an input voltage $V_i$ as shown in FIG. 21A is applied to the input terminal 201, the limiter delivers such an output voltage $V_c$ as shown in FIG. 21B.

The limiters 25 and 35 need not be limited to such a unilateral one as illustrated in FIG. 20. Any limiter may be used to the noise reduction system of FIG. 18. if it can limit the control voltage on a VCA so as to increase or decrease the emphasis within an optimum range.

Figure 22:
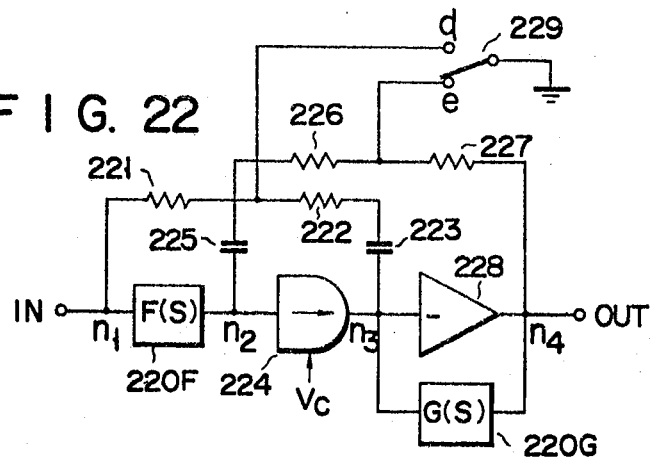
FIG. 22 shows a variable response amplifier which can operate alternatively for the variable response amplifiers shown in FIGS. 15 and 16.

Instead of two variable response amplifiers, one for the encoder and the other for the decoder, a single variable response amplifier may be so designed as to act alternatively for the encoder or the decoder, thereby further reducing the number of elements constituting a noise reduction system. FIG. 22 shows such a variable response amplifier. As illustrated in FIG. 22, the variable response amplifier is constituted by an input terminal IN, a two-port circuit 220F, serially connected resistors 221 and 222, a capacitor 223, a VCA 224, a capacitor 225, resistors 226 and 227, an operational amplifier 228, a switch 229, another two-port circuit 220G and an output terminal OUT.

In the variable response amplifier shown in FIG. 22, the input terminal IN is connected to the two-port circuit 220F and one electrode of the capacitor 223 via the resistors 221 and 222. The other electrode of the capacitor 223 is connected to the output terminal of the VCA 224. The output terminal of the two-port circuit 220F is connected to the input terminal of the VCA 224 and further to one terminal of the resistor 226 through the capacitor 225. The other terminal of the resistor 226 is connected to the output terminal of the operational amplifier 228 through the resistor 227. The resistors 226 and 227 are connected in series to each other. The switch 229 has one movable contact and two stationary contacts e and d. The movable contact is grounded, while the stationary contacts e and d are connected to the junction between the resistors 226 and 227 and the junction between the resistors 221 and 222, respectively. The output terminal of the VCA 224 is connected to the input terminal of the operational amplifier 228 and also to the output terminal of the two-port circuit 220G. The input terminal of the two-port circuit 220G is connected to the output terminal of the operational amplifier 228.

When the movable contact of the switch 229 is put into contact with the stationary contact e, the variable response amplifier of FIG. 22 starts working in the same manner as the variable response amplifier shown in FIG. 15 if the two-port circuits 220F and 220G are equivalent to the resistors 151 and 155 of the variable response amplifier of FIG. 15, respectively. Namely, if hot terminal of each part of the two-port circuit 220F and 220G is each connected with the resistors 151 and 155 of the variable response amplifier of FIG. 15, respectively, and the cold terminals thereof are free, the variable response amplifier shown in FIG. 22 is equivalent to that in FIG. 15. Further, the sum of resistivity of the resistors 221 and 222 equals that of the resistor R of the circuit 153 shown in FIG. 15, and the capacitor 223 corresponds to the capacitor C of the circuit 153 shown in FIG. 15. While the movable contact remains in contact with the stationary contact e, the series circuit constituted by the capacitor 225 and the resistor 226 is grounded at one end and coupled to the VCA 224 at the other end. This means that the VCA 224 is applied with ground potential from the capacitor 225. Thus, no current flows through both the capacitor 225 and the resistor 226 and these elements 225, 226 may be regarded as not being provided. Further, the resistor 227, which provides load to the output of the operational amplifier 228, can be regared as not being provided if its resistivity is 100 ohms or more. Consequently, the variable response amplifier becomes equivalent to the amplifier illustrated in FIG. 15.

When the movable contact of the switch 229 is put into contact with the stationary contact d, the variable response amplifier of FIG. 22 starts working in the same manner as the amplifier shown in FIG. 16. Under this condition, the resistors 221 and 222 and the capacitor 223 are regarded as not being provided. Thus, if the two-port circuits 220F and 220G are equivalent to the resistors 161 and 165, respectively as in the variable response amplifier of FIG. 16, the variable response amplifier shown in FIG. 22 becomes equivalent to the variable response amplifier of FIG. 16.

That is, the two-port circuit 220F corresponds to the resistor 151 of the amplifier of FIG. 15 and the resistor 161 of the amplifier of FIG. 16, and thus resistance $R_{11}$ of the resistor 151 is equal to resistance $R_{22}$ of the resistor 161. Similarly, since the two-port circuit 220G corresponds to the resistors 155 and 165, resistance $R_{12}$ is equal to resistance $R_{21}$.

The two-port circuits 220F, 220G may be of circuits represented by the same functions with each other when switched as the encoder or decoder, respectively. When the two-port circuits 220F, 220G are resistors, it is only required the following relations.

$$F(S) = R_{151} = R_{161}$$

$$G(S) = R_{155} = R_{165}$$

When the circuits 220F, 220G are not pure resistors, it is also necessary to switch the F(S) and G(S). Thus, when denoting the F(S) and G(S) in the encode mode as Fe(S), Ge(S), and as Fd(S), Gd(S) in the decode mode, the relations $$Fe(S) = Gd(S)$$

$$Ge(S) = Fd(S)$$

should be satisfied.

As aforementioned, the modulation of noise level becomes problematical when an input signal has a low level, and the saturation of high frequency component of an input signal becomes problematical when the input signal has a high level. Thus it is desired that the emphasis be increased when the input signal has a low level and decreased when the input signal has a high level. In short, the emphasis should be changed according to the level of the input signal. To achieve this, the controlled amplifier which comprises the variable response amplifier and the pre-emphasis circuit for the encoder and the controlled amplifier which comprises the variable response amplifier and de-emphasis circuit for the decoder constructed as shown in FIGS. 23 and 24, respectively may be useful.

Figure 23:
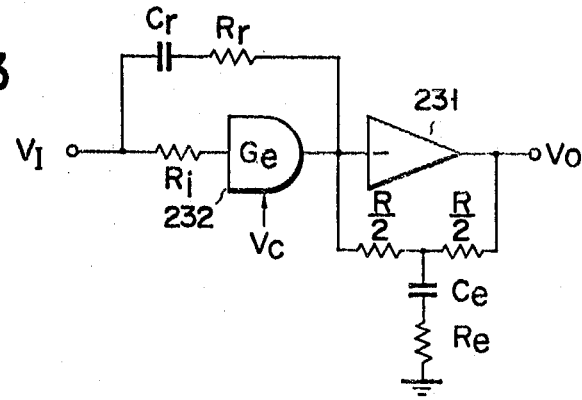
FIG. 23 is a circuit diagram of a controlled amplifier for the encoder, provided with a current-voltage converting circuit having a specific frequency characteristic.
Figure 24:
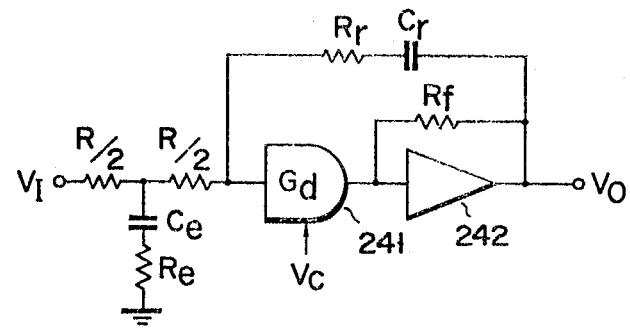
FIG. 24 is a circuit diagram of a controlled amplifier for the decoder, provided with a voltage-current converting circuit having a specific frequency characteristic.

As shown in FIG. 23, the controlled amplifier for the encoder is provided with an operational amplifier 231 and an VCA 232 using a two part circuit. The VCA 232 is controlled by a control voltage Vc and provides a current $G_e$ times as much as the current flowing to it through the resistor $R_i$. It is constructed as illustrated in FIG. 14A.

The transfer function of the controlled amplifier shown in FIG. 23 can be expressed as follows, using the symbols in FIG. 23:

$$\frac{V_o}{V_i} = (\frac{R}{R_i} G_e - \frac{SC_r R}{SC_r R_r + 1}) \times \frac{SC_e(R_e + \frac{R}{4}) + 1}{SC_e R_e + 1} \quad (12)$$

If $(R/R_i)G_e = G$ in equation (12), the frequency-gain characteristic indicated by the value in the first factor will be expressed with G as parameter as illustrated in FIG. 10. The right factor of equation (12) shows the static pre-emphasis of high frequency range. The controlled amplifier of FIG. 23 will obtain a desired frequency-gain characteristic if the amplification factor $G_e$ of the VCA 232 is so controlled as to become high when the level of an input signal is low and low when the level of the input signal is high.

As shown in FIG. 24, the controlled amplifier for the decoder includes a VCA 241, an operational amplifier 242 and the same two part circuit as one shown in FIG. 23. The VCA 241 is controlled by a control voltage Vc and provides a current $G_d$ times as much as the input current. The inverse transfer function of this controlled amplifier can be represented as follows, using the symbols in FIG. 24:

$$\frac{V_i}{V_o} = (\frac{R}{R_f} \cdot \frac{1}{A_d} - \frac{SC_r R}{SC_r R_r + 1}) \times \frac{SC_e(R_e + \frac{R}{4}) + 1}{SC_e R_e + 1} \quad (13)$$

If $G_e/R_i = 1/(R_f A_d)$ in equation (13), the $V_i/V_o$ is proved to be exactly inverse to the transfer function of the controlled amplifier for the encoder, shown in FIG. 23.

Further, if $R/(R_f A_d) = G$ in equation (13), the frequency-gain characteristic indicated by the value in the first parentheses in equation (13) will be expressed with G as parameter as shown in FIG. 12.

Instead of such two controlled amplifiers as shown in FIGS. 23 and 24, a single controlled amplifier may be used to operate alternatively for the encoder or the decoder. Such a single controlled amplifier may be constructed as shown in FIG. 25.

Figure 25:
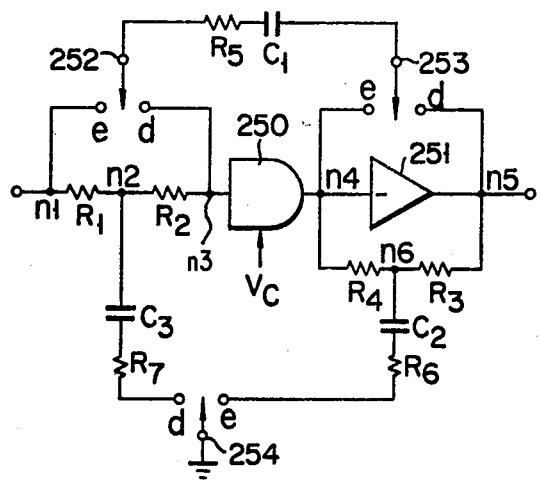
FIG. 25 shows a controlled amplifier which can act alternatively as such controlled amplifiers as shown in FIGS. 23 and 24.

As shown in FIG. 25, the controlled amplifier comprises a first resistor $R_1$ connected between a first node n1 and a second node n2, a second resistor $R_2$ connected between the second node n2 and a third node n3, a VCA 250 the same as shown in FIG. 14A and an operational amplifier 251 having its inversion input and its output connected to the fourth node n4 and a fifth node n5, respectively. The controlled amplifier is further provided with a third resistor $R_3$ connected between the fifth node n5 and a sixth node n6 and a fourth resistor $R_4$ connected between the sixth node n6 and the fourth node n4. There is further provided a first switch 252, a second switch 253 and a third switch 254. A fifth resistor $R_5$ and a first capacitor $C_1$ constitute a serial circuit, which is connected between the first switch 252 and the second switch 253. Similarly, a sixth resistor $R_6$ and a second capacitor $C_2$ constitute a series circuit, which is connected between the sixth node n6 and the third switch 254, and a seventh resistor $R_7$ and a third capacitor $C_3$ constitute another series circuit, which is connected between the second node n2 and the third switch 254.

In the controlled amplifier of FIG. 25, the VCA 250 amplifies an input current by a current amplification factor determined by a control voltage $V_c$. The amplified current flows to the node n4. The switches 252, 253 and 254 have each a movable contact, a stationary contact e for the encoder and a stationary contact d for the decoder. The movable contact, stationary contact e and stationary contact d of the first switch 252 are connected to the fifth resistor $R_5$, the first node n1 and the third node n3, respectively. The movable contact, stationary contact e and stationary contact d of the second switch 253 are connected to the first capacitor $C_1$, the fourth node n4 and the fifth node n5, respectively. The movable contact, stationary contact e and stationary contact d of the third switch 254 are connected to the ground, the sixth node n6 through sixth resistor $R_6$ and the second capacitor $C_2$, and the second node n2 through the seventh resistor $R_7$ and the third capacitor $C_3$, respectively.

The first node n1 and the fifth node n5 act as the input and output terminals of the controlled amplifier of FIG. 25, respectively. The control voltage $V_c$ serves to control the gain and frequency characteristic of the controlled amplifier at the same time. The movable contact of each switch is moved to contact either stational contact e or d. Further, the polarity and bias value of the control voltage $V_c$ are changed over simultaneously. In this way, the variable response amplifier shown in FIG. 25 can obtain two transfer functions which are inverse to each other.

More precisely, when the movable contacts of the switches 252, 253 and 254 are put into contact with the respective stationary contact e, the controlled amplifier starts functioning for the encoder. If $R_1 + R_2 = R_i$, $R_5 = R_r$, $C_1 = C_r$, $C_2 = C_e$, $R_6 = R_e$ and $R_3 = R_4 = R/2$ under this condition, the variable response amplifier becomes exactly equivalent to the amplifier illustrated in FIG. 23. When the movable contacts of the switches 252, 253 and 254 are thrown into contact with the respective stationary contact d, the controlled amplifier starts operating for the decoder. If $C_3=C_e$, $R_7=R_e$ and $R_1=R_2=R/2$ under this condition, the variable response amplifier becomes exactly equivalent to the amplifier shown in FIG. 24.

In short, the controlled amplifier shown in FIG. 25 can obtain two transfer functions inverse to each other if the polarity and bias value of the control voltage $V_c$ are changed over simultaneously so as to satisfy the following conditions:

(1) $R_1=R_2=R_3=R_4=R/2$ $(R_i=R_f=R)$
(2) $R_5=R_r$
(3) $C_1=C_r$
(4) $C_2=C_3=C_e$
(5) $R_6=R_7=R_e$
(6) $G_e=1/G_d$

The resistances $R_1$, $R_2$ and $R_7$ and capacitor $C_3$ constitute F(S) 220F shown in FIG. 22 and the resistances $R_3$, $R_4$ and $R_6$ and capacitor $C_2$ constitute G(S) 220G shown in FIG. 22 with grounded cold terminals.

Thus, it is seen that when the switches 252, 253 and 254 are switched to the "e" position shown in FIG. 25, those circuit elements then connected between the output terminal or n5 and the output VCA 250 at n4 constitute a pre-emphasis circuit. On the other hand, when switches 252, 253 and 254 are switched to the "d" position, those circuit elements between the input terminal or n1 and the input terminal of the VCA 250 at n3 constitute a de-emphasis circuit.

Figure 26:
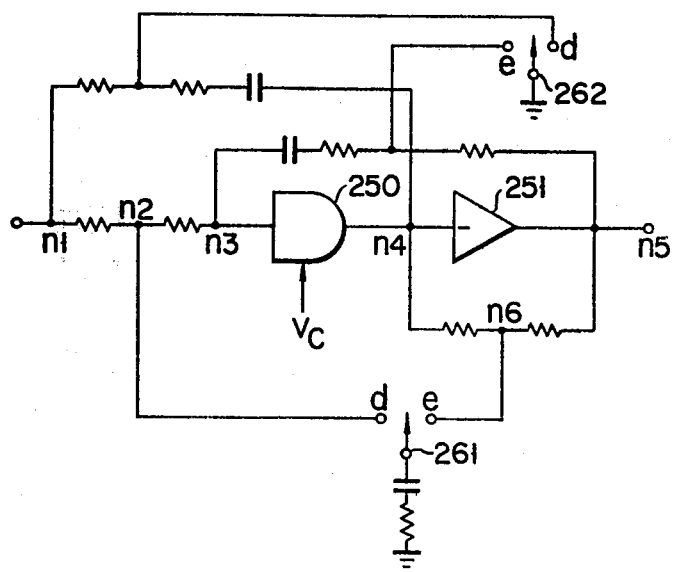
FIG. 26 shows a modification of the controlled amplifier shown in FIG. 25.

FIG. 26 shows another variable response amplifier which can operate alternatively for the encoder and the decoder. This variable response amplifier is similar to the amplifier shown in FIG. 25 except for the following points. First, a first switch 261 may have its stationary contacts e and d connected to the sixth node n6 and the second node n2, respectively and its movable contact grounded through a capacitor $C_e$ and a resistor $R_e$, provided that $C_2=C_3$ and $R_6=R_7$. Secondly, a second switch 262 is used for the switches 252 and 253 of the amplifier shown in FIG. 25 which select whether the series circuit constituted by the fifth resistor $R_5$ and the first capacitor $C_1$ should be connected between the nodes 1 and 4 or between the nodes 3 and 5. When the movable contact of the second switch 262 is thrown to contact the stationary contact e, the resistors and the capacitor which are connected between the nodes 3 and 5 can be regarded equivalently as not being provided.

Figure 27:
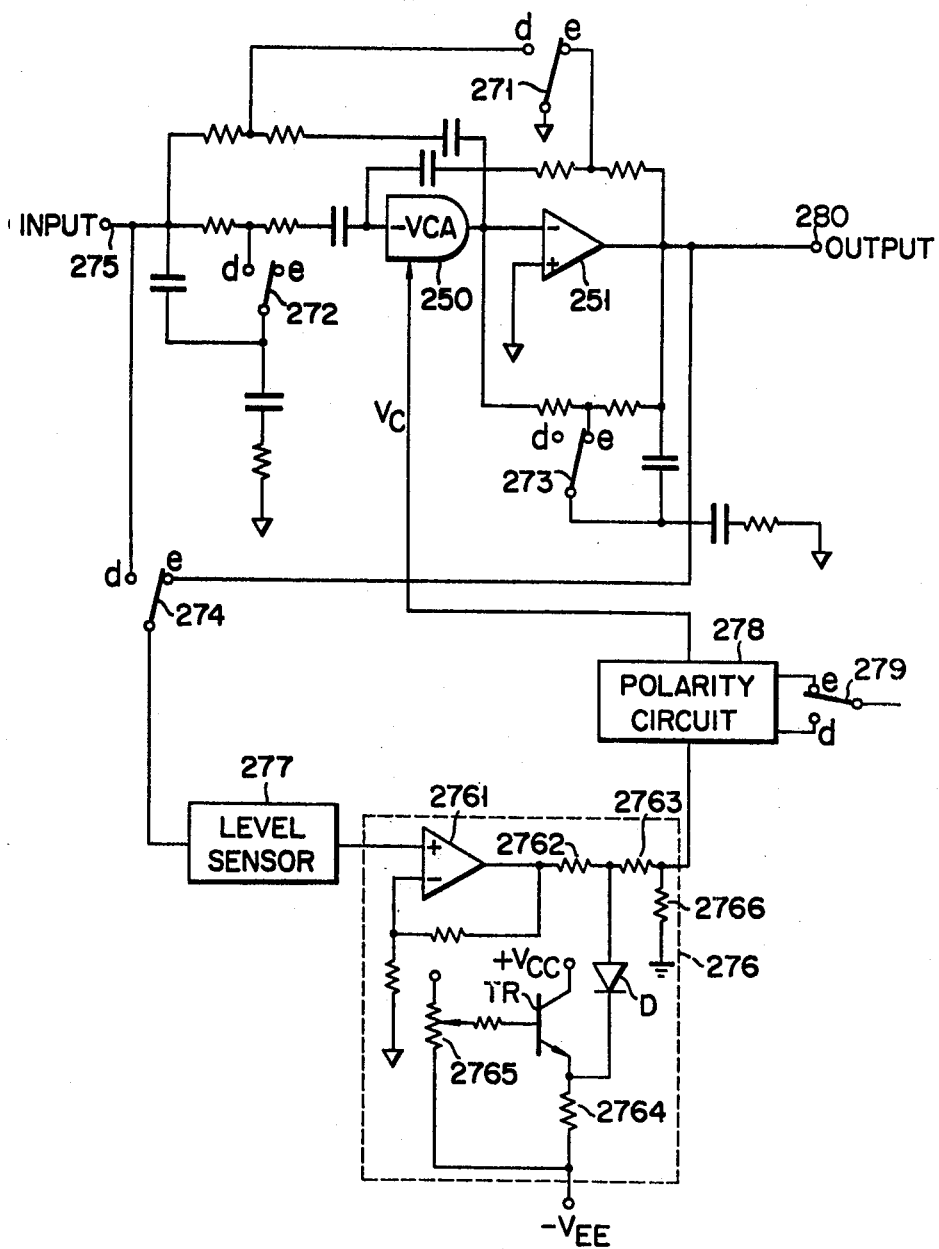
FIG. 27 shows a modified system with a modification of the controlled amplifier of FIG. 26.

FIG. 27 shows a modified system with a modification of the controlled amplifier of FIG. 26. Modified two-part circuits F(S), G(S) shown in FIG. 25 may be used in the noise reduction system in such a manner as illustrated in FIG. 27. In this case, the noise reduction system has five switches 271, 272, 273, 274 and 279 each having a movable contact, a stationary contact e for the encoder and a stationary contact d for the decoder. When the movable contacts of these switches are thrown to contact the stationary contact e, the noise reduction system starts operating for the encoder. During the encoding operation, an input signal is supplied from an input terminal 275 to an output terminal 280 through the VCA 250 and the operational amplifier 251. The output signal is supplied further to an level sensor 277 through the switch 274. Under this condition, the VCA 250 and the operational amplifier 251 correspond to the controlled amplifier 21 of the noise reduction system shown in FIG. 18. The level sensor 277 includes the level sensor 22 and weighting circuit 24.

Figure 28:
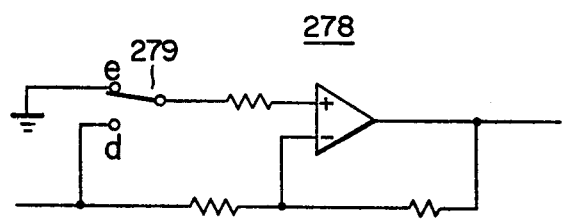
FIG. 28 shows one example of the polarity circuit shown in FIG. 27.

The output voltage of the level sensor 277 is applied to a limiter 276 which includes the limiter circuit modified from the limiter illustrated in FIG. 20. The output voltage of the level sensor 277 is amplified by an amplifier 2761 and then attenuated to the original level by an attenuator comprised of resistors 2762, 2763 and 2766. The junction between the resistors 2762 and 2763 is connected to a voltage source $-V_{EE}$ via a diode D and a resistor 2764. The cathode of the diode D is connected to the emitter of a transistor TR, the base of which is applied with a variable bias from a potentiometer 2765. The limiter 276 amplifies the output of the level sensor 277, and the diode D limits the amplitude of the high level component of the amplfied output of the level sensor 277. Since the attenuator attenuates the output of the level sensor 277 to the original level, the transfer function of the limiter 276 remains 1 while the limiter is set in inoperative condition. The output of the limiter 276 is supplied to the VCA 250 as a control voltage $V_c$ via a polarity circuit 278. A concrete circuit of the circuit 278 is shown in FIG. 28 the construction and operation of which is known and the further explanation thereof is omitted in the specification.

When the movable contacts of the switches 271, 272, 273, 274 and 279 are thrown to contact the stationary contacts d, the noise reduction system starts operating for the decoder. During the decoding operation, an analog signal supplied to the input terminal 275 is supplied directly to the level sensor 277 through the switch 274. Then, the control voltage $V_c$ is applied through the polarity circuit 278 to the VCA 250 from the limiter 276. In this case the output polarity of the circuit 278 is opposite to that in the case of the encoder. Under this condition the VCA 250 and the circuits in front of VCA 250 function is the same manner as the controlled amplfier 31 of the noise reduction system shown in FIG. 18, and the level sensor 277 and limiter 276 correspond to the level sensor 32 and weighting circuit 34 and limiter 35 of the system shown in FIG. 18, respectively.

Figure 29:
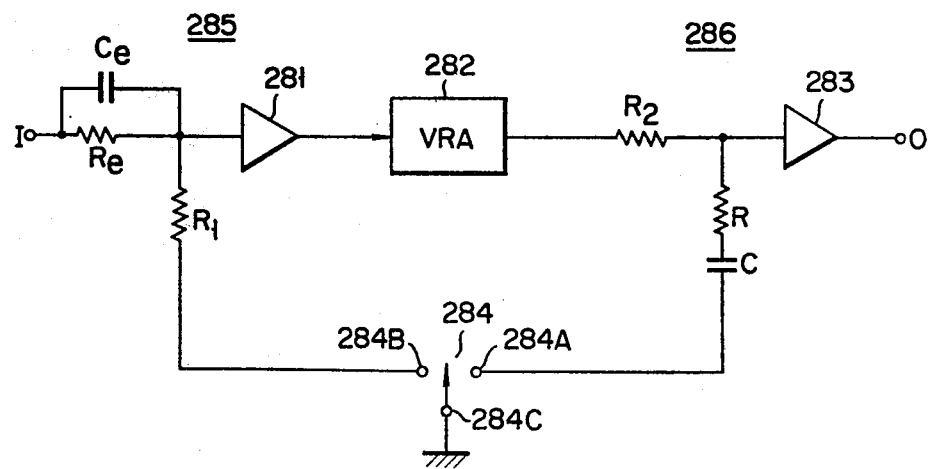
FIG. 29 shows a modification of the controlled amplifiers shown in FIGS. 25 and 26.

The circuit in FIG. 29 is another embodiment of the controlled amplifier alternatively usable as shown in FIG. 25. It comprises an input terminal I, capacitors C and $C_e$, resistors R, $R_1$, $R_2$ and $R_e$, a buffer circuit 281, a variable response amplifier (VRA) for encoder/decoder 282, another buffer circuit 283, a switch 284 and an output terminal O. The input terminal I is connected to the buffer circuit 281 through the capacitor $C_e$ and the resistor $R_e$ which are connected parallel to each other. The output terminal of the buffer circuit 281 is connected to the VRA 282, the output terminal of which is connected to the input terminal of the buffer circuit 283 through the resistor $R_2$ and to one stationary contact 284A of the switch 284 through the resistor R and the capacitor C. The other stationary contact 284B of the switch 284 is connected to the input terminal of the buffer circuit 281 through the resistor $R_1$. The movable contact 284C of the switch 284 is grounded.

In case the movable contact 284C is thrown to contact the stationary contact 284B, the front end circuit comprising resistors $R_1$ and $R_e$ and capacitor $C_e$ serves as the pre-emphasis circuit. The transfer function $G_P(S)$ of the pre-emphasis circuit can be expressed as follows:

$$G_P(S) = \frac{R_1}{R_e + R_1} \times \frac{R_e C_e S + 1}{\frac{R_e R_1}{R_e R_1} C_e S + 1} \quad (14)$$

Figure 30A:
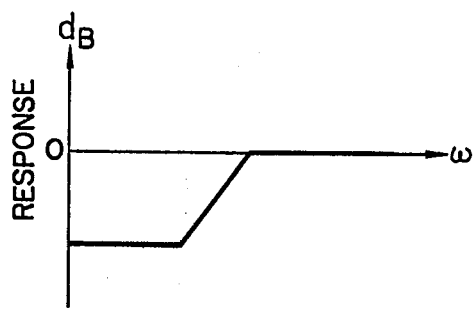
FIGS. 30A and 30B show two weighting functions obtained from the front end circuit and the tail end circuit of the variable response amplifier shown in FIG. 29, respectively.

In equation (14), $\Omega$ denotes an angular frequency, and $S=j\Omega$. Equation (14) indicates that the front end circuit of FIG. 29 exhibits a constant frequency characteristic. Thus, the front end circuit can obtain such a weighting function of high frequency emphasis type as illustrated in FIG. 30A.

In case the movable contact 284C is thrown to contact the stationary contact 284A, the tail end circuit comprising resistors R and $R_2$ and capacitor C serves as the de-emphasis circuit. In this case, the de-emphasis circuit is put in tale of VRA. The transfer function $G_D(S)$ of the de-emphasis circuit can be expressed as follows:

$$G_D(S) = \frac{RCS + 1}{(R_2 + R) \cdot C_s + 1} \quad (15)$$

Figure 30B:
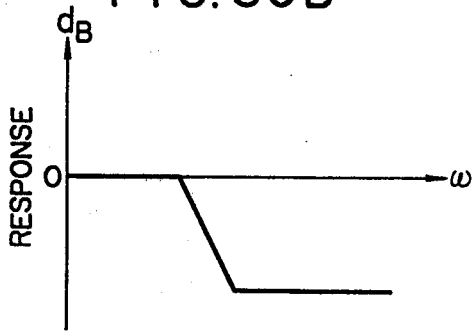

Also in equation (15), $\Omega$ denotes an angular frequency, and $S=j\Omega$. Equation (15) shows that the tail circuit of FIG. 29 can obtain such a weighting function of high frequency attenuation type as illustrated in FIG. 30B. If the high frequency component of an input signal is given gain of, for example, 20dB, the following conditions should be satisfied in order to unify the time constant:

(1) $R_e = 10R$
(2) $R_1 = (10/9)R$
(3) $C = C_e$
(4) $R_2 = 9R$

As a result, in case the movable contact 284C is thrown to contact the stationary contact 284B, the circuit of FIG. 29 show a frequency characteristic which is inverse to the frequency characteristic obtained in case the movable contact 284C is thrown to contact the stationary contact 284A.

Figure 31:
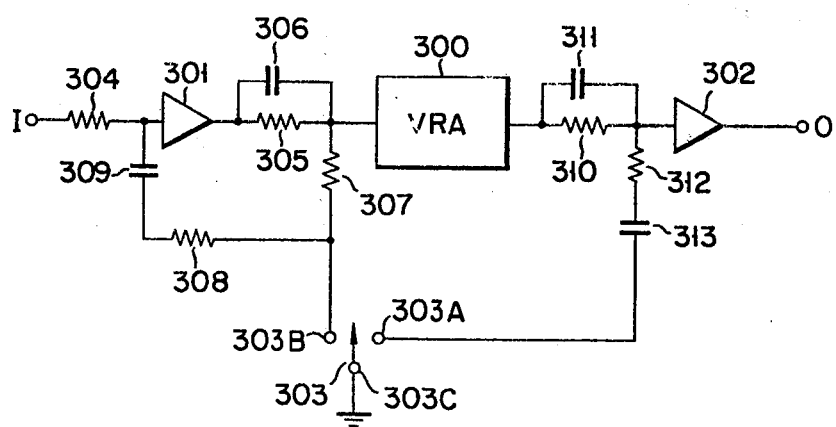
FIG. 31 shows a modification of the controlled amplifier shown in FIG. 29.

The circuit shown in FIG. 29 may be modified as shown in FIG. 31. In the circuit of FIG. 31, a resistor 304 is connected between an input terminal I and the input terminal of a buffer circuit 301. Another resistor 305 and a capacitor 306 are connected in parallel to each other and between the output terminal of the buffer circuit 301 and a VRA for encoder/decoder 300. The input terminal of the VRA 300 is connected to one stationary contact 303B of a switch 303 through a resistor 307. The stationary contact 303B connected to the input terminal of the buffer 301 through a resistor 308 and a capacitor 309. The output terminal of the VRA 300 to the input terminal of another buffer circuit 302 through a parallel circuit constituted by a resistor 310 and a capacitor 311. The input terminal of the buffer circuit 302 is connected to the other stationary contact 303A of the switch 303 through a resistor 312 and a capacitor 313.

Figure 32:
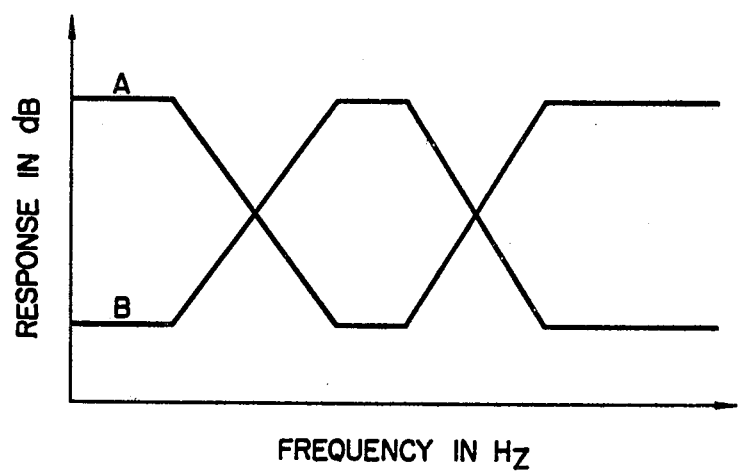
FIG. 32 shows the attenuation characteristics of the front end circuit and the tail end circuit of the variable response amplifier shown in FIG. 31.

Being constructed as illustrated in FIG. 31, the front end circuit and the tail end circuit of VRA can obtain such opposite attenuation characteristics as indicated by lines A and B in FIG. 32, merely by throwing the movable contact 303C to contact alternatively the stationary contacts 303A and 303B. The characteristics shown in FIG. 32 are useful when the recording medium, such as a disc record, has high noise level both in high and low frequency ranges.

Figure 33:
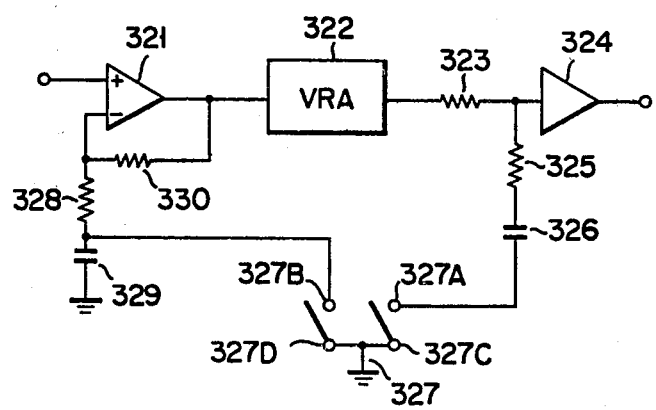
FIG. 33 shows a further modification of the controlled amplifier shown in FIG. 31.

Further, the circuit shown in FIG. 29 may be modified as illustrated in FIG. 33. In the circuit of FIG. 33, an operational amplifier 321 has its output terminal connected to a VRA 322, the output terminal of which is connected to the input terminal of a buffer circuit 324 through a resistor 323. The input terminal of the buffer circuit 324 is connected to one stationary contact 327A of a switch 327 through a resistor 325 and a capacitor 326. The other stationary contact 327B of the switch 327 is connected the junction of a resistor 328 and a capacitor 329 which are connected between inversion input terminal of the operational amplifier 321 and the ground. A resistor 330 is connected between said input terminal and output terminal of the operational amplifier 321. The switch 327 has two movable contacts 327C and 327D which are to contact the stationary contacts 327A and 327B, respectively, and which are grounded.

When both movable contacts 327C and 327D are moved to be disconnected from the stationary contact 327A and 327B, the operational amplifier 321 starts working as a pre-emphasis circuit while the tail end circuit of VRA starts as mere resistor. When both movable contacts 327C and 327D are thrown to contact the stationary contacts 327A and 327B, respectively, the operational amplifier 321 starts functioning as an amplifier whose frequency characteristic is constant and the tail end of VRA starts operating as a de-emphasis circuit.

Figure 1:
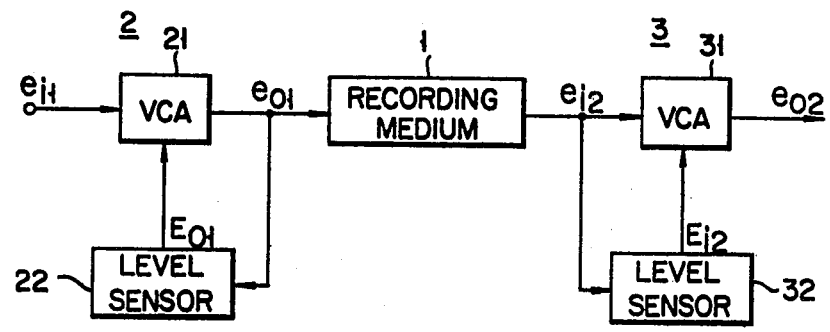
FIG. 1 is a block diagram of a conventional noise reduction system.
Figure 2:
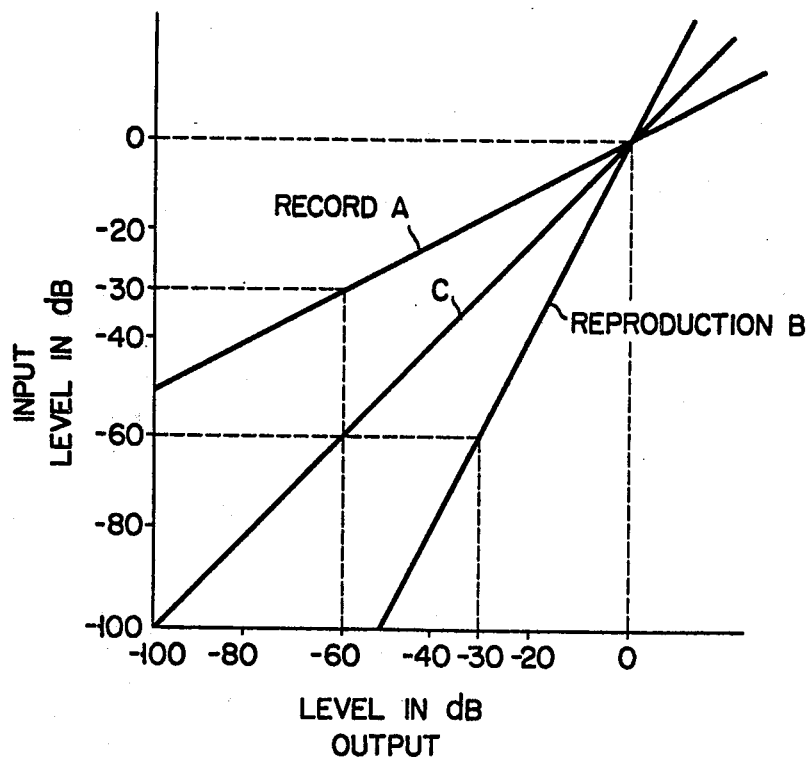
FIG. 2 shows the operation characteristics of the system shown in FIG. 1.

Though the level change of the input signal is comtpressed to ½ in logarithmic scale and expanded double in logarithmic scale as shown in FIG. 2, the level change of the input signal can be compressed or expanded at any desired degree, for example, 1.5, in logarithmic scale without degrading the advantages of this invention.

What we claim is:

1. A noise reduction system having an encoder which compresses the dynamic range of an analog signal for producing a compressed analog audio signal to be transferred and a decoder which expands the compressed analog audio signal obtained from a recording or transmission medium thereby to restore the dynamic range of the analog audio signal, whereby the noise in the analog audio signal caused by the recording or transmission medium is reduced, the encoder including a first controlled amplifier by which the gain and the degree of the emphasis for high frequency range of the encoder are controlled in accordance with the amplitude of the analog audio signal, the decoder having a second controlled amplifier having a transfer function which is substantially inverse to that of the first controlled amplifier of the encoder, the first controlled amplifier comprising a first voltage controlled amplifier (VCA) receiving the analog audio signal and being rendered to vary the amplification factor thereof by a first controlling voltage, a first high-pass filter receiving the analog audio signl, and means for obtaining a difference between the outputs of the first VCA and the first high-pass filter, the encoder further including a first level sensor for detecting the level of the compressed analog audio signal, and a first limiter for limiting the output of the first level sensor to obtain said first controlling voltage in such a manner that the ratio between the gain of the first VCA and the gain of the first high-pass filter at the pass band thereof does not become less than one, and the second controlled amplifier comprises a second voltage controlled amplifier (VCA) rendered to vary the amplification factor in accordance with a second controlling voltage, a second high-pass filter having an input coupled to an output of the second controlled amplifier, and means for adding the output of the second high-pass filter to the compressed analog audio signal to send forth the added signal to the second VCA to constitute a positive feedback loop, the decoder further comprising a second level sensor for detecting the level of the compressed analog audio signal, and a second limiter for limiting the output of the second level sensor to obtain said second controling voltage in such a manner that the loop gain of the positive feedback loop at the pass band of the second high pass filter does not become more than one.

2. A noise reduction system according to claim 1, wherein each of said first and second limiters respectively comprises an amplifier for amlifying the output voltages of the first and second level sensors, an attenuator for attenuating the output voltage of said amplifier by the augment of amplitude achieved by said amplifier, and a diode one end of which is connected to the signal path of said attenuator, and the other end of which is connected to a reference potential source.

3. A noise reduction system according to claim 2, wherein said reference potential source includes an emitter follower, and means for applying a predetermined DC input voltage to an input terminal of said emitter follower so as to obtain a reference potential from emitter of said emitter follower.

4. A noise reduction system according to claim 1, wherein each of said first and second limiters comprises an input terminal to receive the output of the respective level sensors, an output terminal, and a diode one end of which is connected to a node between said input and output terminals and the other end of which is connected to a reference potential source.

5. A noise reduction system according to claim 1, wherein each of said first and second limiters comprises an input terminal to receive the output of the respective level sensor, an output terminal, a diode one end of which is connected to a node between said input and output terminals, a transistor the emitter of which is connected to the other end of said diode, and means for applying a predetermined bias voltage to the base of said transistor.

6. A noise reduction system according to claim 1, wherein said first controlled amplifier includes means for generating a current signal in response to a voltage of the analog audio signal and supplying the current signal to the first voltage controlled amplifier, and a circuit for generating a voltage signal corresponding to an output current of the difference obtaining means.

7. A noise reduction system according to claim 6, wherein at least one of said current signal generating means and voltage signal generating means is provided with at least one element with frequency response for varying an output level thereof in response to a frequency of an input analog audio signal.

8. A noise reduction system according to claim 1, which comprises a compatible circuit selectively operating as one of said encoder and decoder, the compatible circuit including an input terminal, a voltage controlled amplifier, an output terminal, a first series circuit having first and second resistors and connected between the input terminal and the voltage controlled amplifier, an operational amplifier connected between the voltage controlled amplifier and the output terminal, a second series circuit having third and fourth resistors and connected between input and output terminals of the operational amplifier, a feedback circuit connected between the output terminal and the input terminal of the voltage controlled amplifier, a feedforward circuit connected between the input terminal and the output terminal of the voltage controlled amplifier, a first switch for selectively grounding the feedback circuit and the feedforward circuit, a third series circuit having a capacitor and a fifth resistor, and a second switch for selectively connecting the third series circuit between ground and the nodes of the first and second series circuit.

9. A noise reduction system according to claim 8 which further comprises a switching circuit selectively connecting one of a pre-emphasis circuit and a de-emphasis circuit to the compatible circuit, the switching circuit including a switch having first and second stationary contacts and a movable contact connected to ground, an input terminal, a pre-emphasis circuit having a first terminal connected to the input terminal, a second terminal connected to an input of the compatible circuit and a third terminal connected to the first stationary contact, a de-emphasis circuit having a first terminal connected to the output terminal, a second terminal connected to an output of the compatible circuit and a third terminal connected to the second stationary contact.

10. A noise reduction system according to claim 1, wherein said second controlled amplifier includes means for generating a current signal in response to a voltage of the analog audio signal and supplying the current signal to the second voltage controlled amplifier, and a circuit for generating a voltage signal corresponding to an output current of the voltage controlled amplifier.

11. A noise reduction system according to claim 1, which comprises a compatible circuit selectively operating as one of said encoder and decoder, the compatible circuit including an input terminal, a voltage controlled amplifier, an output terminal, a first series circuit having first and second resistors and connected between the input terminal and the voltage controlled amplifier, an operational amplifier connected between the voltage controlled amplifier and the output terminal, a second series circuit having third and fourth resistors and connected between input and output terminals of the operational amplifier, a third series circuit having a fifth resistor and a first capacitor, a first switch having a movable contact connected to one end of the third series circuit, a first stationary contact connected to the input terminal, and a second stationary contact connected to an input terminal of the voltage controlled amplifier, a second switch having a movable contact connected to the other end of the third series circuit, a first stationary contact connected to the output of the voltage controlled amplifier, and a second stationary contact connected to the output terminal, a fourth series circuit having a second capacitor and a sixth resistor and having one end connected to a juncture between the first and second resistors, a fifth series circuit having a third capacitor and a seventh resistor and having an end connected to a juncture between the third and fourth resistors, a third switch having a movable contact, a first stationary contact and a second stationary contact for selectively grounding the fourth series circuit and the fifth series circuit.

12. A noise reduction system according to claim 1 which comprises a compatible circuit selectively operating as one of said encoder and decoder, the compatible circuit including an input terminal, a voltage controlled amplifier, an output terminal, a first series circuit having first and second resistors and a first capacitor and connected between the input terminal and the voltage controlled amplifier, an operational amplifier connected between the voltage controlled amplifier and the output terminal, a second series circuit having third and fourth resistors and connected between input and output terminals of the operational amplifier, a feedback circuit connected between the output terminal and the input terminal of the voltage controlled amplifier, a feedforward circuit connected between the input terminal and the output terminal of the voltage controlled amplifier, a first switch for selectively grounding the feedback circuit and the feedforward circuit, a third series circuit having a second capacitor and a fifth resistor, a second switch for selectively connecting the third series circuit between a juncture of the first and second resistors and ground, a fourth series circuit having a sixth resistor and a third capacitor, a third switch for selectively connecting the fourth series circuit between the ground and a juncture between the third and fourth resistors, a level sensor, a fourth switch for selectively connecting the input terminal and the output terminal to an input terminal of the level sensor, a limiter having an input terminal connected to an output terminal of the level sensor and operating as one of said first and second limiters, an inverter for changing an output polarity of the limiter, and means for sending forth an output of the inverter to the voltage controlled amplifier.

13. A noise reduction system comprising an input terminal for receiving an analog audio signal, an output terminal for delivering a processed analog audio signal, a level sensor having an input terminal selectively connected to the input terminal and the output terminal, a limiter for limiting the output level of the level sensor, a variable response amplifier having a receiving terminal, a delivering terminal and a control terminal for receiving the output of the limiter, a de-emphasis circuit selectively connected between the input terminal and the receiving terminal of the variable response amplifier, a pre-emphasis circuit selectively connected between the output terminal and the delivering terminal of the variable response amplifier, and a switching means for selectively connecting the input terminal of the level sensor to the input and the output terminals and for selectively connecting to be operative the de-emphasis circuit and the pre-emphasis circuit in response to the selective connection of the input terminal of the level sensor with the input and output terminals respectively when the system is used as a decoder or used as an encoder, wherein when the system operates an an encoder, it compresses the dynamic range of an analog audio signal to be transferred and when the system operates as a decoder, it expands the compressed analog audio signal obtained from a recording or a transmission medium to restore the dynamic range of the analog audio signal, the variable response amplifier controls the gain and the degree of the emphasis for high frequency range of the analog audio signal when it is used as an encoder in accordance with the amplitude of the analog audio signal, and has a transfer function which is substantially inverse to that of the encoder when it is used as a decoder, and the variable response amplifier has a high-pass filter, a voltage controlled amplifier rendered to vary an amplification factor thereof in accordance with the output level of the limiter, and means for combining output signals of the high-pass filter and the voltage controlled amplifier.

14. A noise reduction system comprising an input terminal for receiving an analog audio signal, an output terminal for delivering a processed analog audio signal, a level sensor having an input terminal selectively connected to the input terminal and the output terminal, a limiter for limiting the output level of the level sensor, a variable response amplifier having a receiving terminal, a delivering terminal and a control terminal for receiving the output of the limiter, a de-emphasis circuit selectively connected between the output terminal and the delivering terminal of the variable response amplifier, a pre-emphasis circuit selectively connected between the input terminal and the receiving terminal of the variable response amplifier, and a switching means for selectively connecting the input terminal of the level sensor to the input and the output terminals and for selectively connecting to be operative the de-emphasis circuit and the pre-emphasis circuit in response to the selective connection of the input terminal of the level sensor with the input and output terminals respectively when the system is used as a decoder or used as an encoder, wherein when the system operates as an encoder, it compresses the dynamic range of an analog audio signal to be transferred and when the system operates as a decoder, it expands the compressed analog audio signal obtained from a recording or a transmission medium to restore the dynamic range of the analog audio signal, the variable response amplifier controls the gain and the degree of the emphasis for high frequency range of the analog audio signal when it is used as an encoder in accordance with the amplitude of the analog audio signal, and has a transfer function which is substantially inverse to that of the encoder when it is used as a decoder, and the variable response amplifier has a high-pass filter, a voltage controlled amplifier rendered to vary an amplification factor thereof in accordance with the output level of the limiter and means for combining output signals of the high-pass filter and the voltage controlled amplifier.

* * * * *